（12）United States Patent
Chalasani et al.

(10) Patent No.: US 11,929,388 B2
(45) Date of Patent: Mar. 12, 2024

(54) LOCAL PASSIVE MATRIX DISPLAYS

(71) Applicant: Apple Inc., Cupertino, CA (US)

(72) Inventors: Sandeep Chalasani, San Jose, CA (US); Steven E Molesa, San Jose, CA (US); Anatole Huang, Campbell, CA (US); Mahdi Farrokh Baroughi, Los Altos, CA (US); Xia Li, San Jose, CA (US); Yongjie Jiang, Santa Clara, CA (US); Mittul Gupta, San Jose, CA (US); Stanley B Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/894,942

(22) Filed: Aug. 24, 2022

(65) Prior Publication Data

US 2023/0090344 A1 Mar. 23, 2023

Related U.S. Application Data

(60) Provisional application No. 63/247,744, filed on Sep. 23, 2021, provisional application No. 63/247,747, filed on Sep. 23, 2021.

(51) Int. Cl.
*H01L 27/15* (2006.01)
*G09G 3/32* (2016.01)
(Continued)

(52) U.S. Cl.
CPC ............. *H01L 27/156* (2013.01); *G09G 3/32* (2013.01); *H01L 33/382* (2013.01); *H01L 33/62* (2013.01);
(Continued)

(58) Field of Classification Search
CPC ..... H01L 27/156; H01L 33/382; H01L 33/66; G09G 3/32
(Continued)

(56) References Cited

U.S. PATENT DOCUMENTS 8,791,474 B1 7/2014 Bibl et al.
9,601,517 B2 3/2017 Lin et al.
(Continued)

FOREIGN PATENT DOCUMENTS

EP 2359403 B1 9/2018

*Primary Examiner* — Prabodh M Dharia
(74) *Attorney, Agent, or Firm* — Treyz Law Group, P.C.; Joseph F. Guihan; Jinie M. Guihan

(57) ABSTRACT

A display may be formed by an array of light-emitting diodes mounted to the surface of a display substrate. The light-emitting diodes may be inorganic light-emitting diodes formed from separate crystalline semiconductor structures. An array of pixel control circuits may be used to control light emission from the light-emitting diodes. Each pixel control circuit may be configured to control one or more respective passive matrices. To control partial pixel cells in the display, a donor pixel control circuit in a partial pixel cell may control the pixels in a receptor partial pixel cell without a pixel control circuit. To mitigate the size of an inactive area of the display, fanout signal lines for the display may be formed in the light-emitting active area of the display. The fanout signal lines may be formed between a row of pixel control circuits and a bottom edge of the light-emitting active area.

20 Claims, 20 Drawing Sheets

(51) Int. Cl.
*H01L 33/38* (2010.01)
*H01L 33/62* (2010.01)

(52) U.S. Cl.
CPC . *G09G 2300/06* (2013.01); *G09G 2320/0626* (2013.01)

(58) Field of Classification Search
USPC .............. 345/83, 440.1; 257/40; 438/69
See application file for complete search history.

(56) References Cited

U.S. PATENT DOCUMENTS

| | | |
|---|---|---|
| 9,728,119 B2 | 8/2017 | Snijder |
| 10,153,257 B2 | 12/2018 | Cok et al. |
| 10,229,630 B2 | 3/2019 | Lau et al. |
| 10,312,309 B2 | 6/2019 | Lin et al. |
| 10,468,397 B2 | 11/2019 | Cok |
| 10,650,737 B2 | 5/2020 | Vahid Far et al. |
| 10,763,323 B2 | 9/2020 | Moy et al. |
| 10,847,077 B2 | 11/2020 | Sakariya et al. |
| 10,991,780 B2 | 4/2021 | Wu |
| 2007/0085077 A1* | 4/2007 | Yu .................. H10K 59/131 257/40 |
| 2014/0264700 A1* | 9/2014 | Janson ................ G01J 1/0266 438/69 |
| 2015/0332635 A1* | 11/2015 | Lau ..................... G09G 3/32 345/83 |
| 2018/0247582 A1 | 8/2018 | Park et al. |
| 2019/0347985 A1* | 11/2019 | Shaeffer ................ H05B 45/20 |
| 2020/0013975 A1 | 1/2020 | Bibl et al. |
| 2020/0273928 A1* | 8/2020 | Che .................. H10K 59/1315 |
| 2021/0257435 A1* | 8/2021 | Kim .................. H10K 59/353 |
| 2021/0366374 A1* | 11/2021 | Wei ..................... G09G 3/3233 |

* cited by examiner

LOCAL PASSIVE MATRIX DISPLAYS

This application claims the benefit of provisional patent application No. 63/247,744, filed Sep. 23, 2021, and provisional patent application No. 63/247,747, filed Sep. 23, 2021, which are hereby incorporated by reference herein in their entireties.

BACKGROUND

This relates generally to electronic devices and, more particularly, to electronic devices with displays.

Electronic devices often include displays. For example, an electronic device may have a liquid crystal display in which liquid crystal display pixels are used to display images for a user. Liquid crystal displays often include light-emitting diode backlight units for providing backlight illumination. Display efficiency can be adversely affected by inefficiencies in producing backlight illumination and in transmitting backlight illumination through liquid crystal display structures. Liquid crystal display structures also exhibit limited contrast ratios. Organic light-emitting diode displays have been developed that exhibit high contrast ratios, but these devices may consume more power than desired due to the inefficiencies in their organic light-emitting diodes. It can also be challenging to ensure that organic light-emitting diodes exhibit desired lifetimes.

SUMMARY

An electronic device may include a display. The display may be formed by an array of light-emitting diodes mounted to the surface of a display substrate. The light-emitting diodes may be inorganic light-emitting diodes formed from separate crystalline semiconductor structures. An array of pixel control circuits may be used to control light emission from the light-emitting diodes. Each pixel control circuit may be used to supply drive signals to a respective set of the light-emitting diodes arranged in a passive matrix.

Each pixel control circuit may be configured to control one or more respective passive matrices. However, some of the passive matrices may be interrupted by a border for the display (e.g., a rounded corner of the active area). These interrupted groups of pixels may be referred to as partial pixel cells. Some of the partial pixel cells may still have a dedicated pixel control circuit. Some of the partial pixel cells may not have a dedicated pixel control circuit due to their pixel control circuit falling outside of the target border for the display.

To control the partial pixel cells, additional pixel control circuits may be included that are misaligned relative to the remaining array of the pixel control circuits. Alternatively, a donor pixel control circuit in a partial pixel cell may control the pixels in a receptor partial pixel cell without a pixel control circuit. Anode contacts in different columns may be electrically connected to allow for the donor pixel control circuit to control the receptor partial pixel cell.

To mitigate the size of an inactive area of the display, fanout signal lines for the display may be formed in the light-emitting active area of the display. The fanout signal lines may be formed between a row of pixel control circuits and a bottom edge of the light-emitting active area. Signal lines may additionally be formed between a column of the pixel control circuits and a side edge of the light-emitting active area.

DETAILED DESCRIPTION

Figure 1:
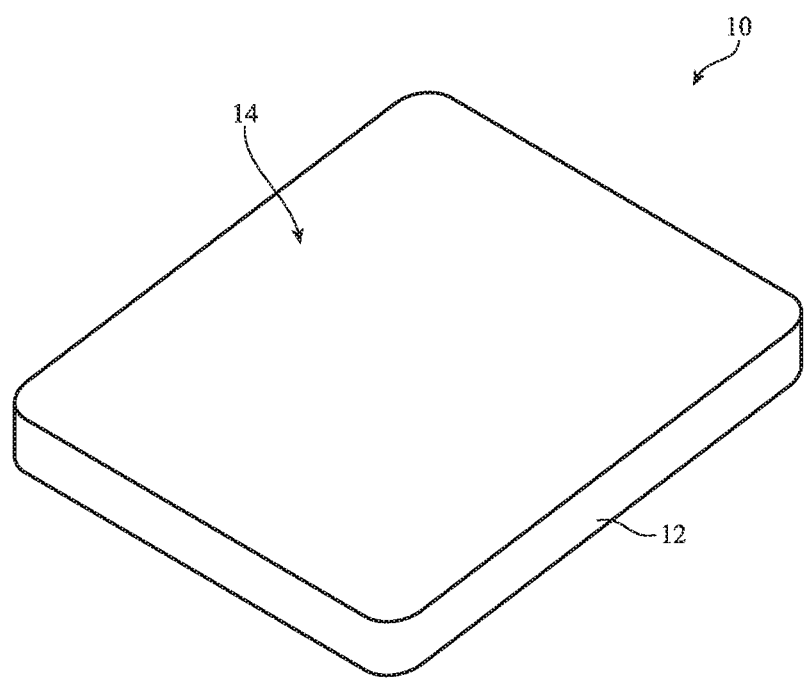
FIG. 1 is a perspective view of an illustrative electronic device having a display in accordance with an embodiment.

An illustrative electronic device of the type that may be provided with a display is shown in FIG. 1. An electronic device such as electronic device 10 of FIG. 1 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television or other display for video, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. The configuration of device 10 that is shown in FIG. 1 (e.g., a portable device configuration in which device 10 is a cellular telephone, media player, wrist device, tablet computer, or other portable computing device) is shown as an example. Other configurations may be used for device 10 if desired.

Device 10 may have one or more displays such as display 14 mounted in housing structures such as housing 12. Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components. Touch sensor electrodes may be used to capture touch input from a user's finger or a stylus and/or may be used to gather fingerprint data.

Display 14 may include an array of pixels that emit light such as an array of light-emitting diode pixels. In general, display 14 may use liquid crystal display technology, light-emitting diode display technology such as organic light-emitting diode display technology, plasma display technology, electrophoretic display technology, electrowetting display technology, or other types of display technology. Configurations in which display 14 is based on an array of light-emitting diodes are sometimes described herein as an example. This is, however, merely illustrative. Other types of display technology may be incorporated into device 10 if desired.

Figure 2:
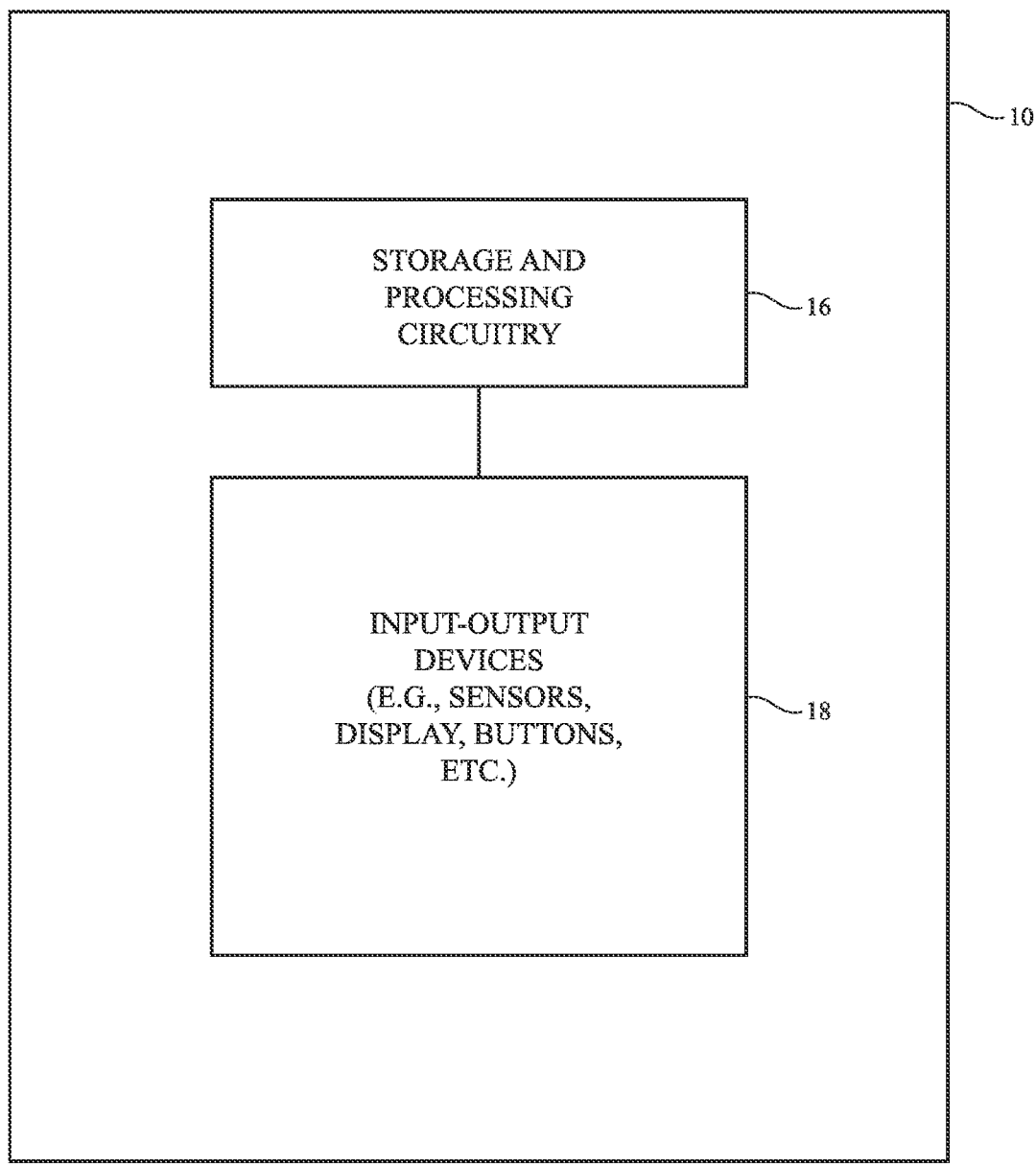
FIG. 2 is a schematic diagram of an illustrative electronic device having a display in accordance with an embodiment.

A schematic diagram of an electronic device such as electronic device 10 of FIG. 1 is shown in FIG. 2. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio codec chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, fingerprint sensors, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include one or more displays such as display 14 of FIG. 1.

Control circuitry 16 may be used to run software on device 10 such as operating system code and applications. During operation of device 10, the software running on control circuitry 16 may display images on display 14 in input-output devices 18.

Figure 3:
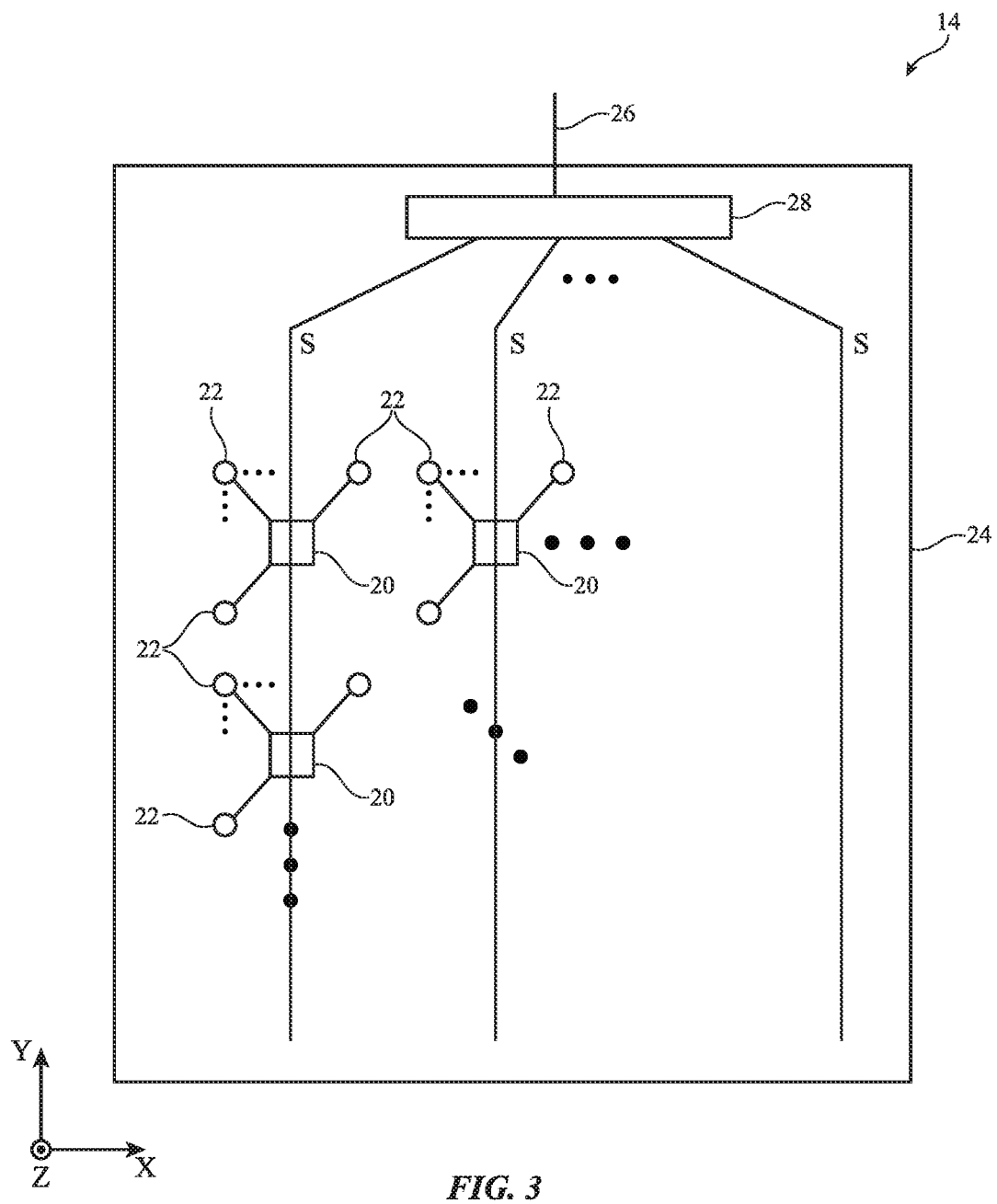
FIG. 3 is a diagram of an illustrative display in accordance with an embodiment.

As shown in the illustrative diagram of FIG. 3, display 14 may include layers such as substrate layer 24. Layers such as substrate 24 may be formed from layers of material such as glass layers, polymer layers, composite films that include polymer and inorganic materials, metallic foils, semiconductors such as silicon or other semiconductor materials, layers of material such as sapphire (e.g., crystalline transparent layers, ceramics, etc.), or other material. Substrate 24 may be planar or may have other shapes (e.g., concave shapes, convex shapes, shapes with planar and curved surface regions, etc.). The outline of substrate 24 (e.g., when viewed from above along the Z-direction) may be circular, oval, rectangular, square, may have a combination of straight and curved edges, or may have other suitable shapes. As shown in the rectangular substrate example of FIG. 3, substrate 24 may have left and right vertical edges and upper and lower horizontal edges.

Display 14 may have an array of pixels 22 for displaying images for a user. Sets of one or more pixels 22 may be controlled using respective pixel control circuits 20 (sometimes referred to as driving circuits 20 or microdrivers 20). Pixel control circuits 20 may be formed using integrated circuits (e.g., silicon integrated circuits) and/or thin-film transistor circuitry on substrate 24. The thin-film transistor circuitry may include thin-film transistors formed from silicon (e.g., polysilicon thin-film transistors or amorphous silicon transistors) and/or may include thin-film transistors based on semiconducting oxides (e.g., indium gallium zinc oxide transistors or other semiconducting oxide thin-film transistors). Semiconducting oxide transistors such as indium gallium zinc oxide transistors may exhibit low leakage currents and may therefore be advantageous in configurations for display 14 where it is desirable to lower power consumption (e.g., by lowering the refresh rate for the pixels of the display). Configurations for display 14 in which pixel control circuits 20 are each formed from a silicon integrated circuit and a set of thin-film semiconducting oxide transistors may be used if desired.

Pixels 22 may be organized in an array (e.g., an array having rows and columns). Pixel control circuits 20 may be organized in an associated array (e.g., an array having rows and columns). As shown in FIG. 3, pixel control circuits 20 may be interspersed among the array of pixels 22. Pixels 22 and pixel control circuits 20 may be organized in arrays with rectangular outlines or may have outlines of other suitable shapes. There may be any suitable number of rows and columns in each array (e.g., ten or more, one hundred or more, or one thousand or more).

Each pixel 22 may be formed from a light-emitting component such as a light-emitting diode. If desired, each pixel may contain a pair of light-emitting diodes or other suitable number of light-emitting diodes for redundancy. In this type of configuration, the pair of light-emitting diodes in each pixel can be driven in parallel (as an example). In the event that one of the light-emitting diodes fails, the other light-emitting diode will still produce light. Alternatively or in addition, multiple pixel control circuits may be configured to control each pixel. In the event that one of the pixel control circuit fails, the other pixel control circuit will still control the pixel.

Display driver circuitry such as display driver circuitry 28 may be coupled to conductive paths such as metal traces on substrate 24 using solder or conductive adhesive. Display driver circuitry 28 may contain communications circuitry for communicating with system control circuitry over path 26. Path 26 may be formed from traces on a flexible printed circuit or other cable or may be formed using other signal path structures in device 10. The control circuitry may be located on a main logic board in an electronic device in which display 14 is being used. During operation, the control circuitry on the logic board (e.g., control circuitry 16 of FIG. 1) may supply circuitry such as display driver circuitry 28 with information on images to be displayed on display 14. To display the images on display pixels 22, display driver circuitry 28 may supply corresponding image data, control signals, and/or power supply signals to signal lines S. The signal lines provide corresponding image data, control signals, and power to the pixel control circuits 20. Based on the received power, image data, and control signals, the pixel control circuits 20 direct a respective subset of pixels 22 to generate light at desired intensity levels.

Signal lines S may carry analog and/or digital control signals (e.g., scan signals, emission transistor control signals, clock signals, digital control data, power supply signals, etc.). In some cases, a signal line may be coupled to a respective column of pixel control circuits 20. In some cases, a signal line may be coupled to a respective row of pixel control circuits 20. Each pixel control circuit 20 may be coupled to one or more signal lines. Circuitry 28 may be formed on the upper edge of display 14 (as in FIG. 3), on the lower edge of display 14, on the upper and left edges of display 14, on the upper, left, and right edges of display, or any other desired location(s) within display 14.

Display control circuitry such as circuitry 28 may be implemented using one or more integrated circuits (e.g., display driver integrated circuits such as timing controller integrated circuits and associated source driver circuits and/or gate driver circuits) or may be implemented using thin-film transistor circuitry implemented on substrate 24.

Pixels 22 may be organic light-emitting diode pixels or liquid crystal display pixels. Alternatively, pixels 22 may be formed from discrete inorganic light-emitting diodes (sometimes referred to as microLEDs). Pixels 22 may include light-emitting diodes of different colors (e.g., red, green, blue). Corresponding signal lines may be used to carry red, green, and blue data. Pixel arrangements of other colors may be used, if desired (e.g., four color arrangements, arrangements that include white pixels, three-pixel configurations with pixels other than red, green, and blue pixels, etc.). To produce different colors, the light-emitting diodes of pixels 22 may be constructed from different materials systems (e.g., AlGaAs for red diodes, GaN multiple quantum well diodes with different quantum well configurations for green and blue diodes, respectively), may be formed using different phosphorescent materials or different quantum dot materials to produce red, blue, and/or green luminescence, or may be formed using other techniques or combinations of these techniques. The light-emitting diodes of pixels 22 may radiate upwards (i.e., pixels 22 may use a top emission design) or may radiate downwards through substrate 24 (i.e., pixels 22 may use a bottom emission design). The light-emitting diodes may have thicknesses of about 0.5 to 10 microns and may have lateral dimensions of about 2 microns to 100 microns (as examples). Light-emitting diodes with other thicknesses (e.g., below 2 microns, above 2 microns, etc.) and that have other lateral dimensions (e.g., below 10 microns, below 20 microns, above 3 microns, above 15 microns, etc.) may also be used, if desired.

If desired, digital control signals can be provided to circuits 20 (over signal lines S), which may then produce corresponding analog light-emitting drive signals based on the digital control signals. During operation of display 14, each pixel control circuit 20 may supply output signals to a corresponding set of pixels 22 based on the control signals received by that pixel control circuit from display driver circuitry 28.

Figure 4:
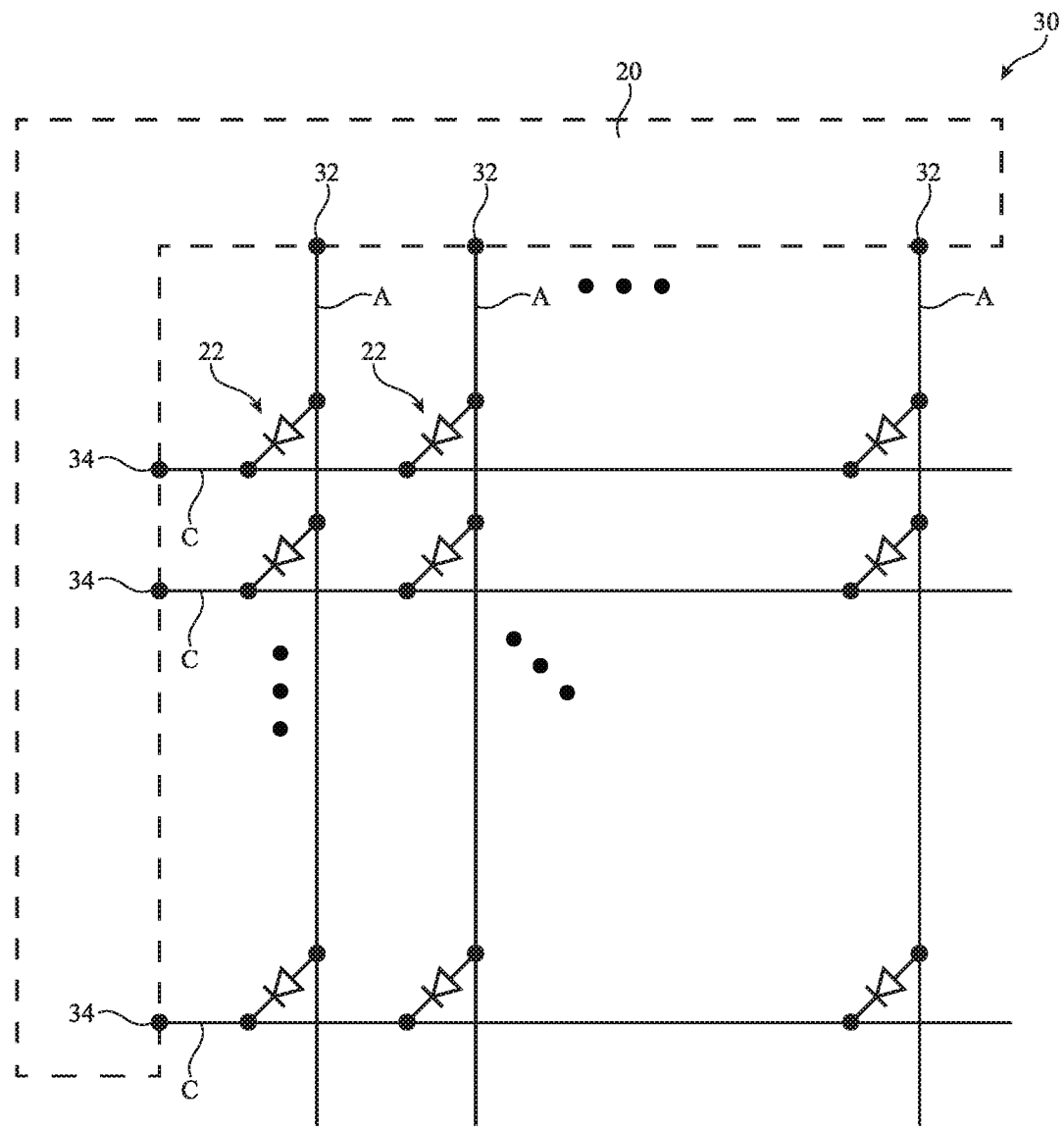
FIG. 4 is a schematic diagram of an illustrative passive matrix of light-emitting diodes that is controlled by a pixel control circuit in accordance with an embodiment.

As one example, each pixel control circuit 20 may control a respective local passive matrix 30 of LED pixels 22. FIG. 4 is a schematic diagram of a local passive matrix 30 of LED pixels 22. As shown in FIG. 4, the anode of each LED 22 is coupled to a respective anode contact line A (sometimes referred to as anode contact A or anode line A). The LEDs 22 of each column in the passive matrix are connected to a common anode contact A. The cathode of each LED 22 is coupled to a respective cathode contact line C (sometimes referred to as cathode contact C or cathode line C). The LEDs 22 of each row in the passive matrix are connected to a common cathode contact C.

Pixel control circuit 20 may control the current and voltage provided to each anode line A. The pixel control circuit 20 may also control the voltage provided to each cathode contact line C. In this way, pixel control circuit 20 controls the current through each light-emitting diode 22, which controls the intensity of light emitted by each light-emitting diode. During operation of the passive matrix, pixel control circuit 20 may scan the pixels 22 row-by-row at high speeds to cause each LED 22 to emit light at a desired brightness level. In other words, each pixel in the first row is updated to a desired brightness level, then each pixel in the second row is updated to a desired brightness level, etc.

Pixel control circuit 20 may have first output terminals 32 that are coupled to the anode contact lines A and second output terminals 34 that are coupled to the cathode contact lines C. Pixel control circuit 20 may have one output terminal 32 per anode contact line and one output terminal 34 per cathode contact line, as one example. Using the passive matrix as in FIG. 4 therefore allows pixel control circuit 20 to control 64 light-emitting diodes (e.g., in an 8×8 grid) using only 16 outputs (8 anode output terminals and 8 cathode output terminals).

Figure 5:
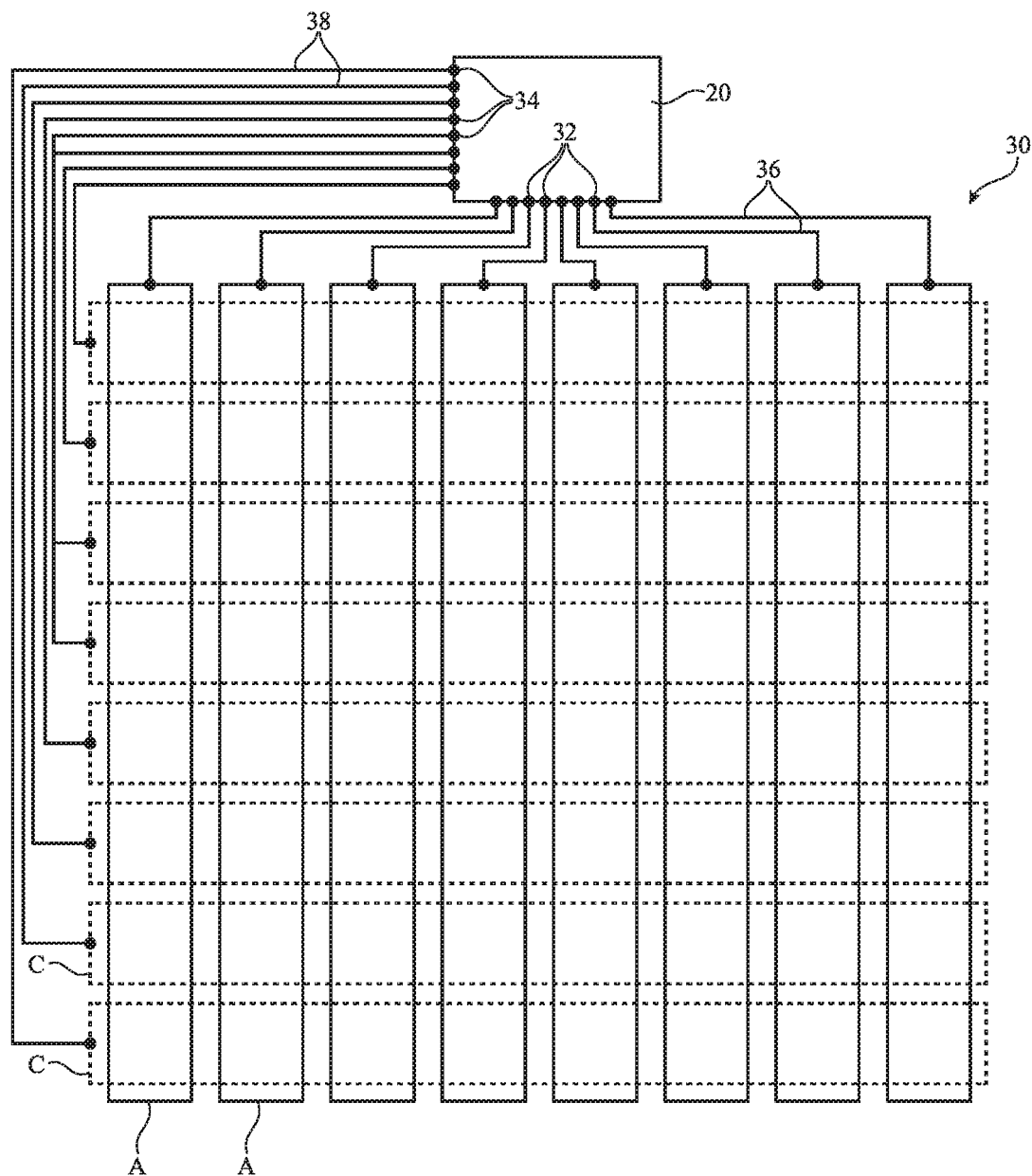
FIG. 5 is a top view of an illustrative passive matrix of light-emitting diodes with a grid of anode contacts and cathode contacts in accordance with an embodiment.

FIG. 5 is a top view of a passive matrix 30 showing how pixel control circuit 20 may be electrically connected to respective anode contacts A and cathode contacts C. In the example of FIG. 5, the local passive matrix of LEDs is an 8×8 array. Therefore, there are eight anode contacts A and eight cathode contacts C arranged in an overlapping grid. The anode contacts extend orthogonally to the cathode contacts, with each position of overlap between an anode contact and a cathode contact defining a respective LED pixel 22.

As shown in FIG. 5, the display may include routing lines such as routing lines 36 and 38 to electrically connect the output terminals of pixel control circuit 20 to the anode and cathode contacts. Specifically, a number of routing lines 36 are included to connect the output terminals 32 of pixel control circuit 20 to respective anode contacts A. A number of routing lines 38 are included to connect the output terminals 34 of pixel control circuit 20 to respective cathode contacts C. Including routing lines 36 and 38 allows for the footprint and position of pixel control circuit 20 to be selected independently from the position of the anode and cathode contacts. Routing lines 36 and 38 may be formed by metal traces (signal lines) on one more layers of substrate 24 and/or conductive vias through one or more layers of substrate 24, as an example.

Figure 6A:
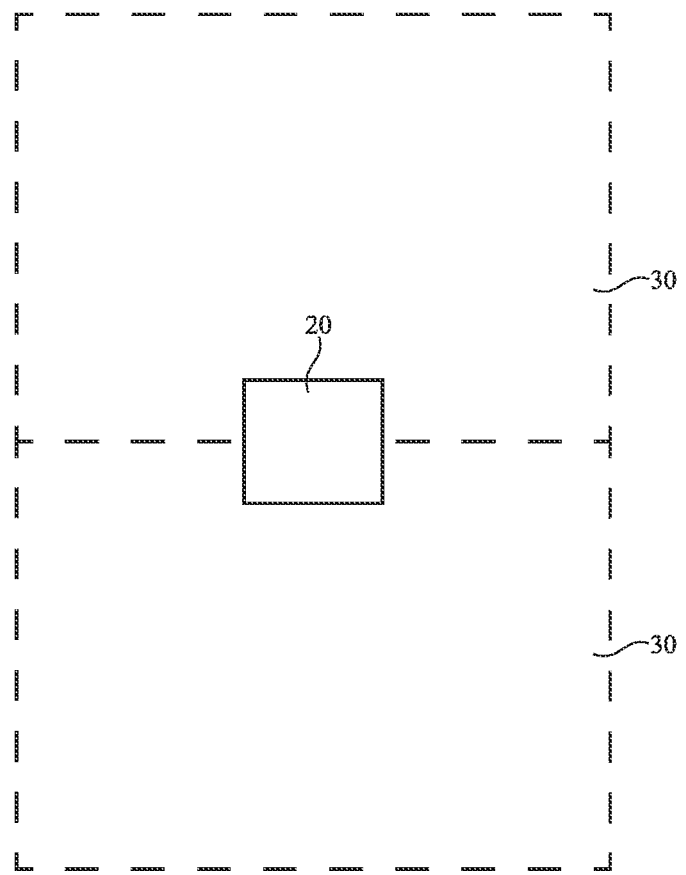
FIG. 6A is a schematic diagram of an illustrative pixel control circuit that controls two passive matrices in accordance with an embodiment.
Figure 6B:
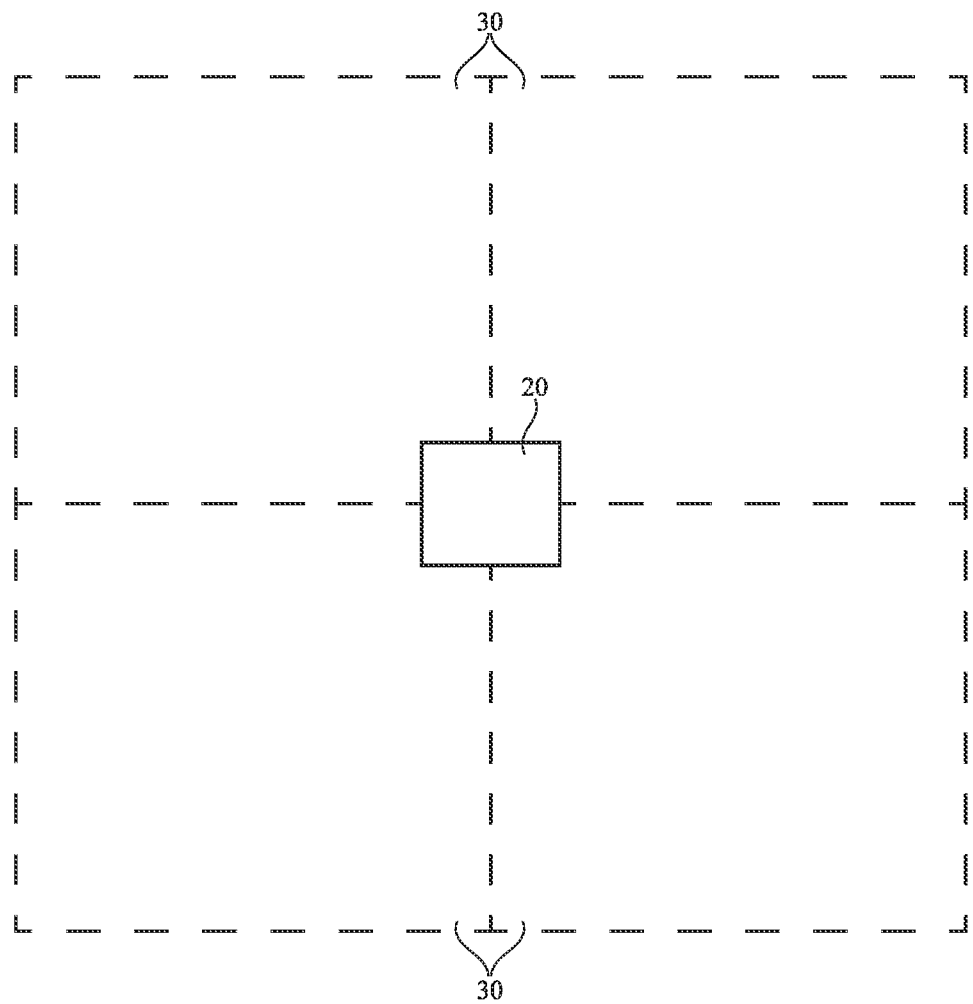
FIG. 6B is a schematic diagram of an illustrative pixel control circuit that controls four passive matrices in accordance with an embodiment.

Each pixel control circuit 20 may control a single passive matrix of LED pixels or multiple passive matrices of LED pixels. FIG. 6A is a schematic diagram showing how an illustrative pixel control circuit 20 may control first and second passive matrices 30 of LEDs 22. FIG. 6B is a schematic diagram showing how an illustrative pixel control circuit 20 may control first, second, third, and fourth passive matrices 30 of LEDs 22. In general, each pixel control circuit 20 may control any desired number of LED passive matrices 30 (e.g., one, two, three, four, more than four, etc.). Each passive matrix 30 may include any desired number of rows of LEDs and columns of LEDs (e.g., more than one, more than three, more than six, more than ten, more then twenty, more than fifty, less than six, less than ten, less then twenty, less than fifty, etc.).

Ultimately, each pixel control circuit 20 may be configured to control a respective subset of LED pixels. The respective subset of LED pixels controlled by each pixel control circuit may be referred to as a pixel cell, passive matrix cell, etc. Each pixel cell may be made up of one or more discrete passive matrices, as shown and discussed in connection with FIGS. 4-6.

Figure 7:
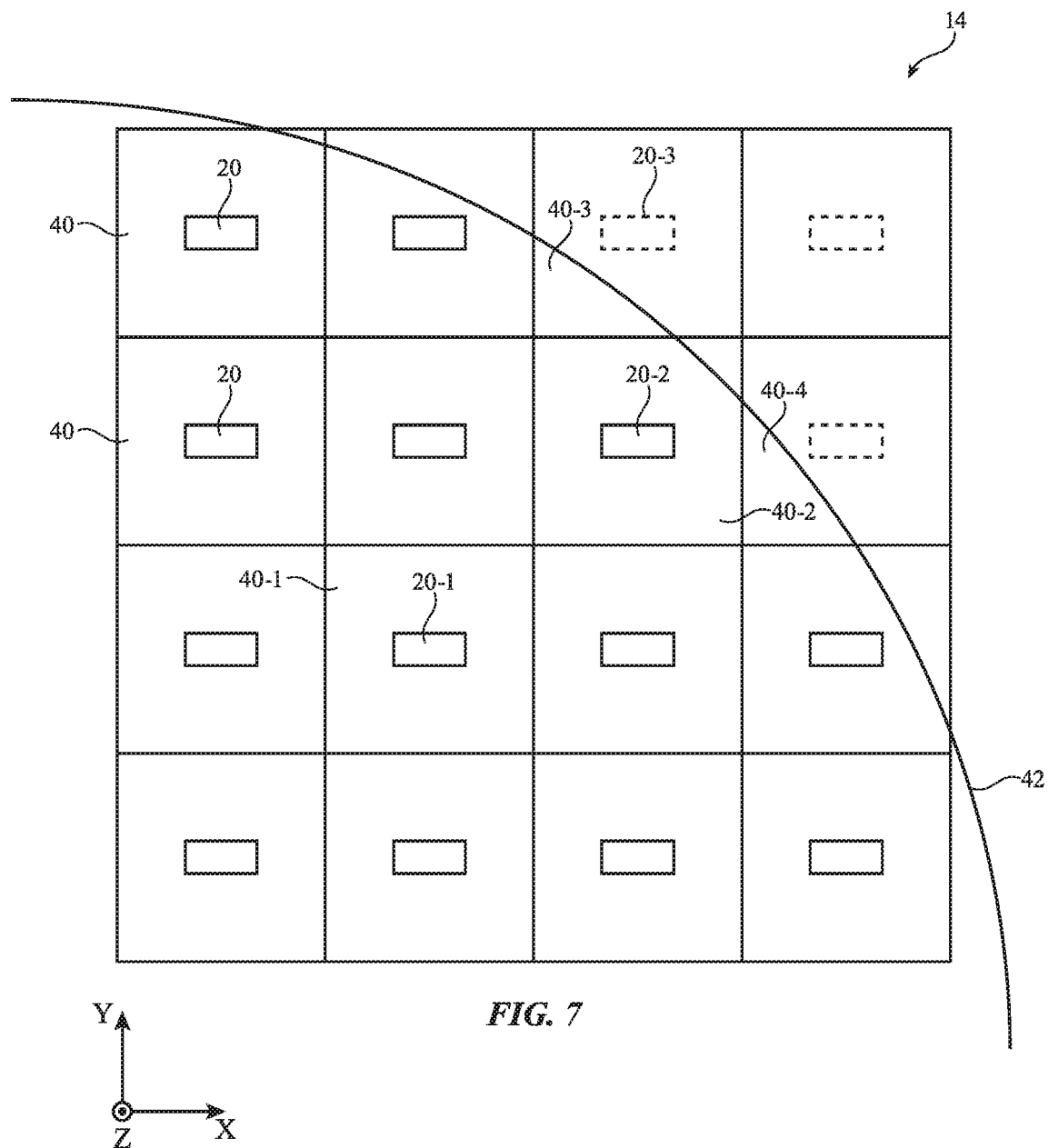
FIG. 7 is a top view of an illustrative display with an active area border the interrupts pixel cells with pixel control circuits in accordance with an embodiment.

FIG. 7 is a top view of an illustrative display with a plurality of pixel control circuits 20 and corresponding pixel cells 40. Each pixel cell may include an array of LED pixels (e.g., microLEDs) arranged in one or more passive matrices. Each pixel control circuit 20 may apply signals to the anode contacts A and cathode contacts C of the passive matrices in its respective pixel cell 40 to control the light emitted by the pixels in its pixel cell 40.

This pixel control scheme may be impacted by the geometry of the light-emitting area of the display. For example, consider an example where each pixel control circuit is configured to control an m×n cell of pixels (with m rows and n columns). When the pixel control circuit has an associated m×n cell of pixels to control, the pixel control circuit may be referred to as controlling a full pixel cell. The pixel control circuits may be distributed across the display such that most of the pixel control circuits have an associated full m×n cell of pixels to control. However, the geometry of the display may cause some pixel control circuits to have only a partial pixel cell. In other words, a pixel control circuit may control less pixels than it is capable of. Conversely, some LED pixels may not have an associated pixel control circuit (due to the geometry of the display causing the respective pixel control circuit for those LED pixels to be omitted).

The light-emitting active area of the display may, for example, have a footprint with rounded corners. FIG. 7 shows how the active area of the display follows a border 42 that is rounded in the corners of the display. Border 42 (sometimes referred to as spline 42) may be a target border for the display. Light-emitting LED pixels 22 are included and omitted to approximate the curvature of border 42 in the rounded corner.

FIG. 7 shows how target border 42 crosses through some of pixel cells 40. This causes some of the pixel cells to be partial pixel cells as previously described. For example, a first pixel control circuit 20-1 controls a full pixel cell 40-1 whereas a second pixel control circuit 20-2 controls a partial pixel cell 40-2. The partial pixel cell 40-2 is interrupted by target border 42. Accordingly, pixels outside of border 42 within pixel cell 40-2 may be omitted from the display.

Additionally, pixel control circuits outside of the target border may be omitted from the display. In the example of FIG. 7, three pixel control circuits, including pixel control circuit 20-3, are positioned outside the target border 42. Including these pixel control circuits may increase the size of the non-light-emitting inactive area of display 14. Therefore, to reduce the size of the non-light-emitting inactive area, these pixel control circuits (as indicated by dashed lines) may be omitted from the display. This allows for substrate 24 to be cut to have approximately the same shape as target border 42, with only a small non-light-emitting inactive area between the edge of the light-emitting active area and an edge of the substrate.

Omitting these pixel control circuits may result in partial pixel cells that do not have a dedicated pixel control circuit. FIG. 7 shows how partial pixel cell 40-3 does not have a dedicated pixel control circuit (because its corresponding pixel control circuit 20-3 is positioned outside the target border and is therefore omitted). Similarly, partial pixel cell 40-4 does not have a dedicated pixel control circuit (because its corresponding pixel control circuit is positioned outside the target border and is therefore omitted).

Display 14 may include additional components to ensure that the partial pixel cells with cutoff pixel control circuits are driven and emit desired amounts of light during operation.

Figure 8:
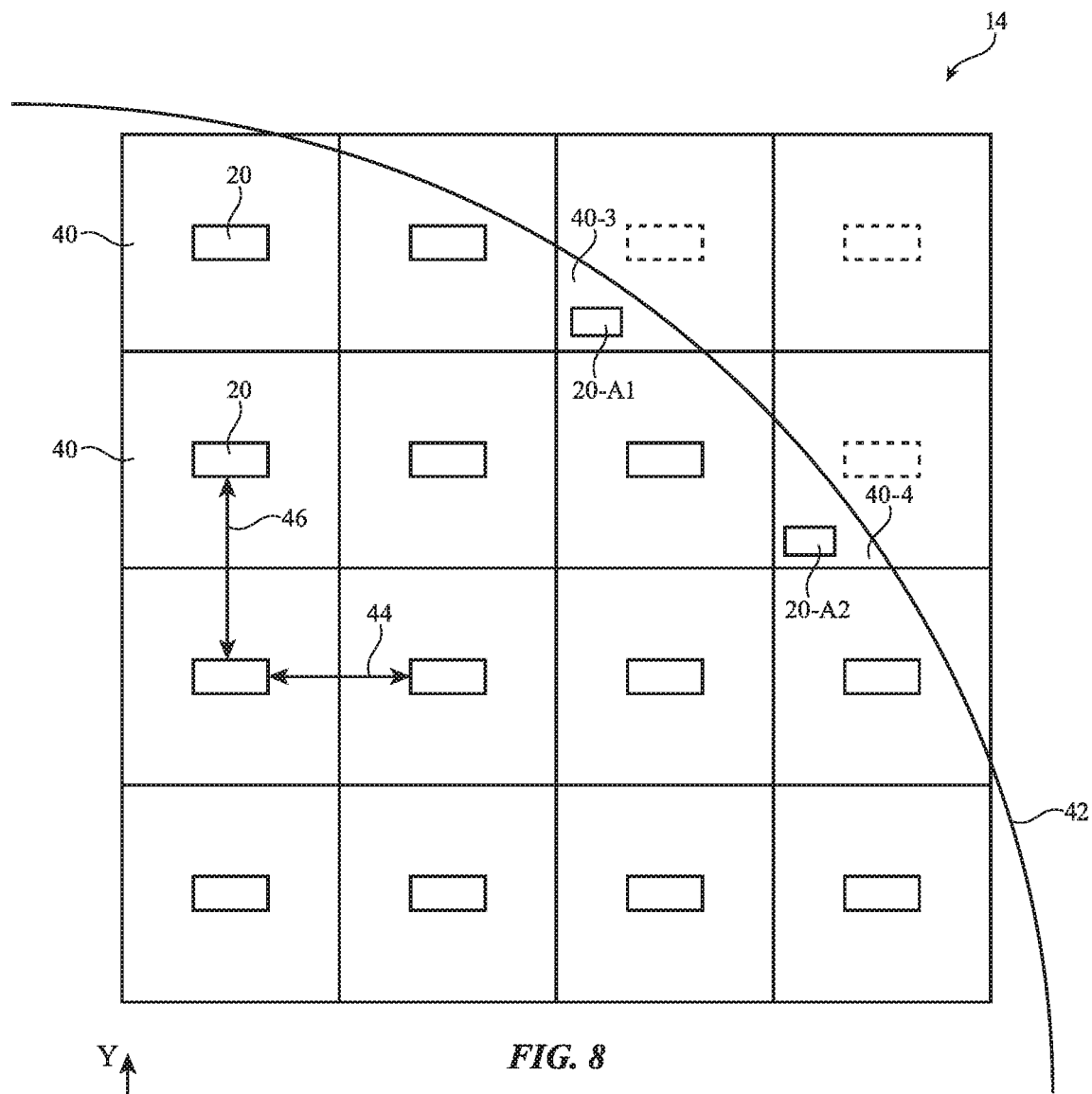
FIG. 8 is a top view of an illustrative display with additional pixel control circuits that are used to control partial pixel cells in accordance with an embodiment.

A first option for controlling these partial pixel cells is to include additional pixel control circuits, as shown in FIG. 8. Partial pixel cell 40-3 may include an additional pixel control circuit 20-A1 that is shifted inside the target border 42. There is therefore sufficient room available on the display substrate 24 to include the additional pixel control circuit 20-A1. Partial pixel cell 40-4 may include an additional pixel control circuit 20-A2 that is shifted inside the target border 42. There is therefore sufficient room available on the display substrate 24 to include the additional pixel control circuit 20-A2.

In the central portion of the display, the pixel control circuits may have a pitch 44 in the X-direction and a pitch 46 in the Y-direction. Pitches 44 and 46 may be uniform across the display such that the pixel control circuits (which may be formed by integrated circuits) are arranged in evenly spaced rows and columns (as shown in FIGS. 7 and 8). The additional pixel control circuits 20-A1 and 20-A2, however, are misaligned relative to the surrounding rows and/or columns. In other words, the majority of the pixel control circuits 20 are arranged in rows and columns. Pixel control circuit 20-A1 is shifted in the X-direction relative to the pixel control circuit columns. Pixel control circuit 20-A1 is shifted in the Y-direction relative to the pixel control circuit rows.

As shown in FIG. 8, the spacing between pixel control circuit 20-A1 and its adjacent pixel control circuits is less than pitches 44 and 46. Similarly, the spacing between pixel control circuit 20-A2 and its adjacent pixel control circuits is less than pitches 44 and 46. The position of the additional pixel control circuits is therefore modified relative to the pattern of the rest of the pixel control circuits in order to ensure that all of the partial pixel cells have a corresponding pixel control circuit.

Figure 9:
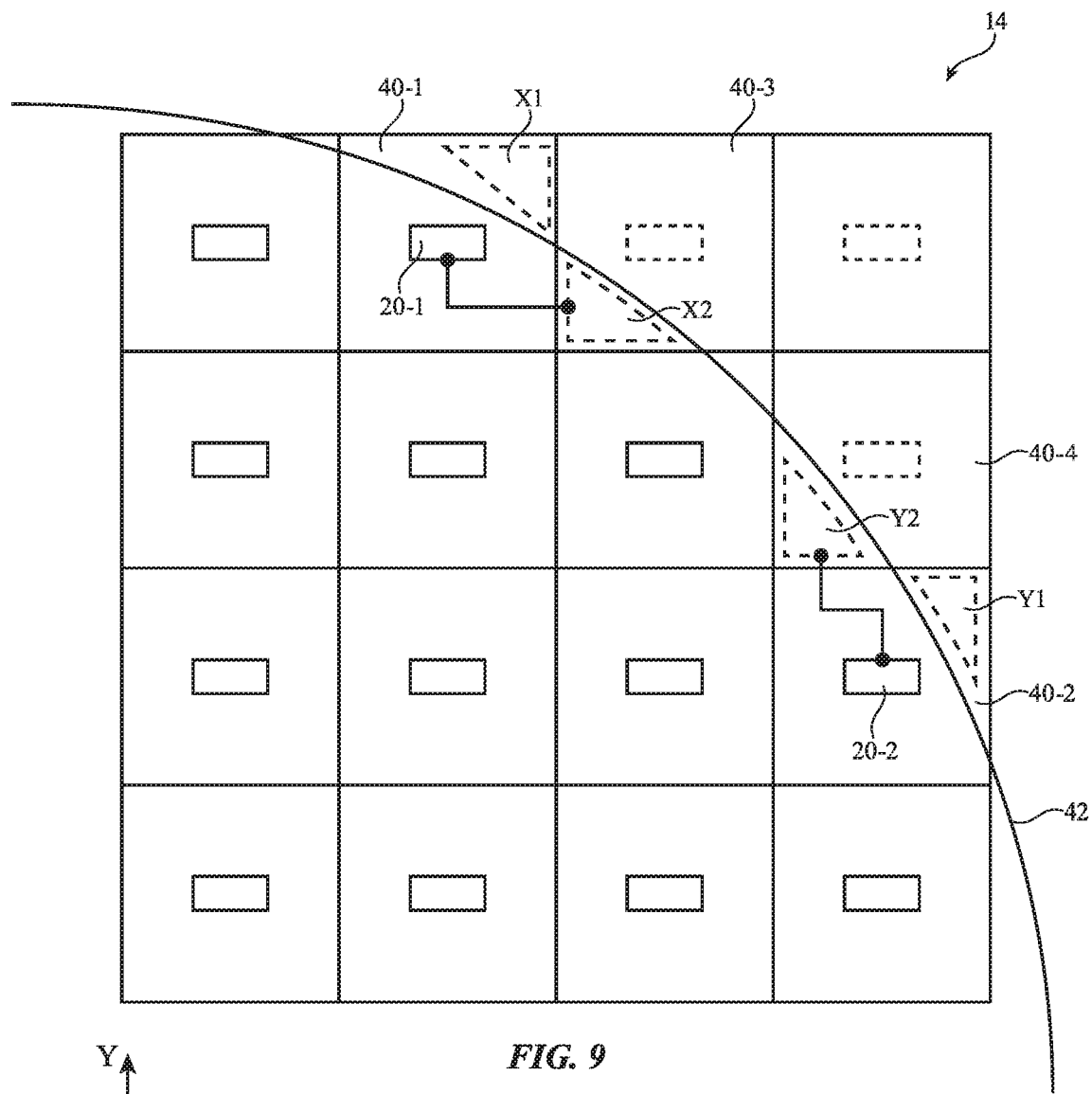
FIG. 9 is a top view of an illustrative display with a partial pixel cell that is controlled by a neighboring pixel control circuit in accordance with an embodiment.

FIG. 9 shows an option for controlling partial pixel cells without additional pixel control circuits. As shown in FIG. 9, the pixel driver circuit of a neighboring partial pixel cell may be used to drive the pixels of a partial pixel cell. As an example, each pixel control circuit drives a 16×16 grid of pixels (arranged in one or more passive matrices). The pixel control circuit therefore has output terminals for the 16×16 grid of pixels and logic and control circuitry for driving the 16×16 grid of pixels. However, partial pixel cells in the display may include less than the full 16×16 grid of pixels.

Consider pixel cell 40-1, which includes pixel control circuit 20-1 (arranged per the regular pixel control circuit pattern). Pixel cell 40-1 is interrupted by border 42 and is therefore a partial pixel cell. The partial pixel cell may only include, as an example, 150 pixels (instead of the 256 pixels of a full 16×16 pixel cell). Pixel control circuit 20-1 therefore only has 150 pixels to control instead of the full 256. Pixel control circuit 20-1 is therefore being underutilized by 106 pixels. In other words, pixel control circuit 20-1 has the capability to control 106 extra pixels due to the omitted pixels in its pixel cell. Pixel such as pixels X1 outside of the target border would normally be driven by pixel control circuit 20-1. However, the pixels in area X1 are omitted from the display because they are outside the border 42.

Meanwhile, partial pixel cell 40-3 includes pixels in area X2 but does not have a dedicated pixel control circuit. Instead of including an additional pixel control circuit as in FIG. 8, the pixels in area X2 may be driven by the underutilized, neighboring pixel control circuit 20-1. Partial pixel cell 40-3 may include less than 106 pixels in area X2 (e.g., less pixels than the underutilization amount of pixel control circuit 20-1). Therefore, pixel control circuit 20-1 has the capability to control all of the pixels in area X2 in addition to the pixels in its own partial pixel cell.

Using this type of scheme, where underutilized pixel control circuits are used to control pixels that otherwise do not have a dedicated pixel control circuit, may allow for the number of pixel control circuits in the display to be reduced while maintaining a small inactive border area.

As another example of this concept, consider pixel cell 40-2, which includes pixel control circuit 20-2 (arranged per the regular pixel control circuit pattern). Pixel cell 40-2 is interrupted by border 42 and is therefore a partial pixel cell. Pixel control circuit 20-2 is therefore being underutilized. In other words, pixel control circuit 20-2 has the capability to control extra pixels due to the omitted pixels in its pixel cell. Pixel such as pixels Y1 outside of the target border would normally be driven by pixel control circuit 20-2. However, the pixels in area Y1 are omitted from the display because they are outside the border 42.

Meanwhile, partial pixel cell 40-4 includes pixels in area Y2 but does not have a dedicated pixel control circuit. Instead of including an additional pixel control circuit as in FIG. 8, the pixels in area Y2 may be driven by the underutilized, neighboring pixel control circuit 20-2. Partial pixel cell 40-4 may include less pixels than the underutilization amount of pixel control circuit 20-2). Therefore, pixel control circuit 20-2 has the capability to control all of the pixels in area Y2 in addition to the pixels in its own partial pixel cell.

Figure 10:
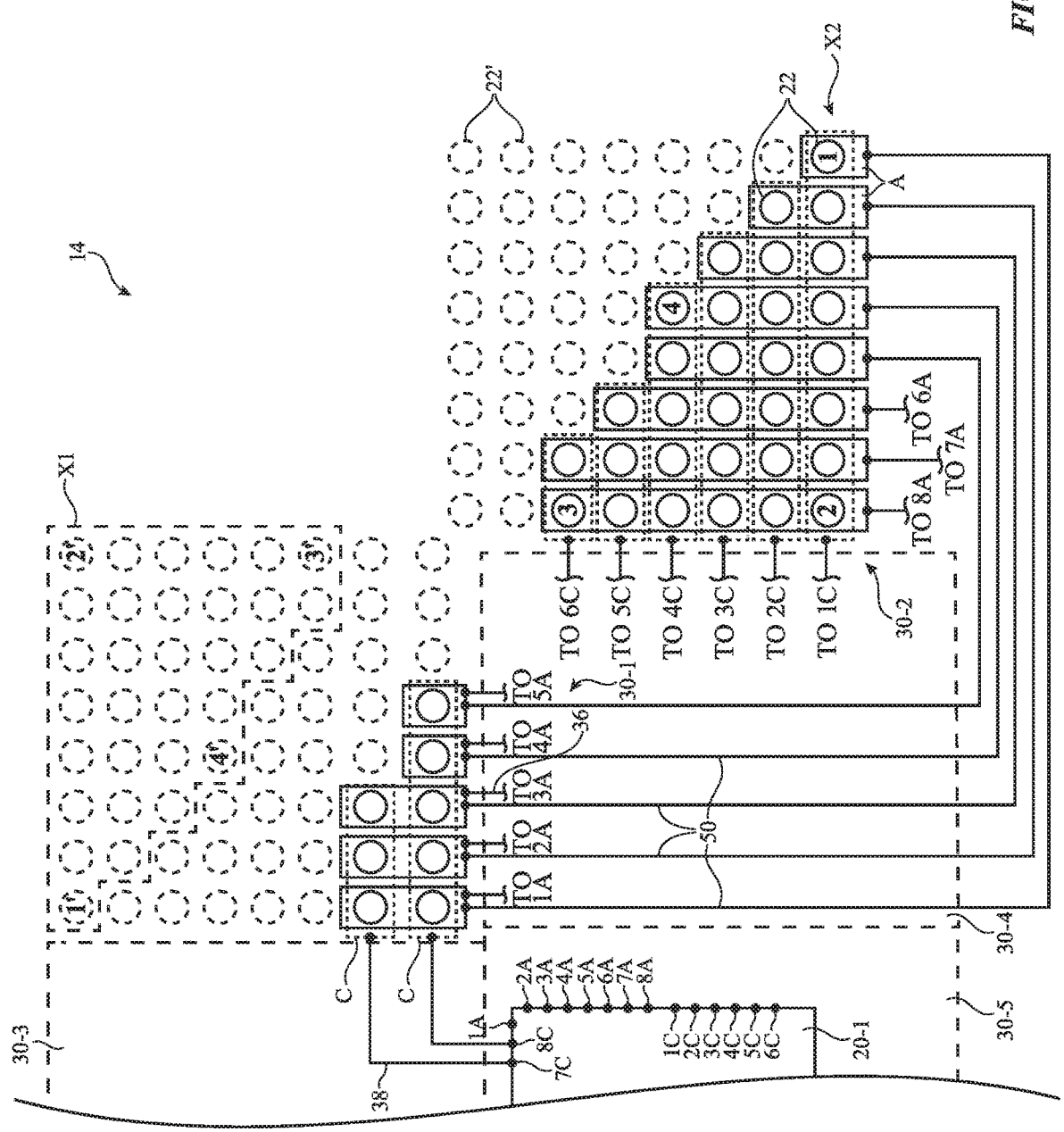
FIG. 10 is a top view of an illustrative display showing how anode contacts in a donor passive matrix may be electrically connected to anode contacts in a receptor passive matrix in accordance with an embodiment.

FIG. 10 is a top view of an illustrative display showing how pixels in a pixel cell may be controlled by the pixel control circuit of a different, neighboring pixel cell. In the example of FIG. 10, each pixel control circuit is configured to control four passive matrices (similar to as shown in FIG. 6B). In this example, each passive matrix is an 8×8 grid (e.g., similar to as shown in FIG. 5). In a central portion of the display, each pixel control circuit may control four 8×8 passive matrices.

Along border 42 (see FIG. 9), one or more of the 8×8 passive matrices may be interrupted. The result may be a partial passive matrix that includes less than 8 full rows and/or less than 8 full columns. FIG. 10 shows how, adjacent to the border of the display, a first partial passive matrix 30-1 (that includes 8 pixels) and a second partial passive matrix 30-2 (that includes 31 pixels) are present. Partial passive matrix 30-1 may be part of pixel cell 40-1 (see FIG. 9) that includes a dedicated pixel control circuit 20-1. Partial passive matrix 30-2 is part of pixel cell 40-3 (see FIG. 9) that does not include a dedicated pixel control circuit. Each partial passive matrix includes light-emitting pixels 22. FIG. 10 also shows the footprint of omitted pixels 22'. Omitted pixels 22' would complete the 8×8 passive matrix for each one of passive matrices 30-1 and 30-2. However, the border of the display causes pixels 22' to be omitted.

Pixel control circuit 20-1 in FIG. 10 may control passive matrices 30-3, 30-4, and 30-5 in addition to partial passive matrix 30-1. One or both of passive matrices 30-3 and 30-4 may be partial passive matrices. Passive matrix 30-5 may be a full passive matrix (with a full 8×8 grid of light-emitting pixels).

Pixel control circuit 20-1 may have eight anode outputs 1A-8A (e.g., output terminals 32 in FIG. 5) and eight cathode outputs 1C-8C (e.g., output terminals 34 in FIG. 5) that are configured to drive passive matrix 30-1. However, passive matrix 30-1 is a partial passive matrix. Therefore, the output terminals of pixel control circuit 20-1 may drive partial passive matrix 30-2 from a neighboring pixel cell in addition to partial passive matrix 30-1.

As shown in FIG. 10, cathode outputs 1C-6C in pixel control circuit 20-1 are electrically connected to cathode contacts C in partial passive matrix 30-2. Cathode outputs 7C-8C in pixel control circuit 20-1 are electrically connected to cathode contacts in partial passive matrix 30-1. Each cathode output terminal in pixel control circuit 20-1 may be electrically connected to a corresponding cathode contact by a respective signal routing line 38. The signal routing lines 38 may be formed by metal traces (signal lines) on one more layers of substrate 24 and/or conductive vias through one or more layers of substrate 24, as an example. In order to access the cathode contacts C in partial passive matrix 30-2, some of signal routing lines 38 (e.g., for output terminals 1C-6C) may be routed from an interior of pixel cell 40-1 (which includes passive matrices 30-1, 30-3, 30-4, and 30-5) past the periphery of pixel cell 40-1 to an exterior of pixel cell 40-1.

As shown in FIG. 10, anode outputs 1A-5A in pixel control circuit 20-1 are electrically connected to anode contacts A in partial passive matrix 30-1. Anode outputs 6A-8A in pixel control circuit 20-1 are electrically connected to anode contacts in partial passive matrix 30-2. Each anode output terminal in pixel control circuit 20-1 may be electrically connected to a corresponding anode contact by a respective signal routing line 36. The signal routing lines 36 may be formed by metal traces (signal lines) on one more layers of substrate 24 and/or conductive vias through one or more layers of substrate 24, as an example. In order to access the anode contacts A in partial passive matrix 30-2, some of signal routing lines 36 (e.g., for output terminals 6A-8A) may be routed from an interior of pixel cell 40-1 (which includes passive matrices 30-1, 30-3, 30-4, and 30-5) past the periphery of pixel cell 40-1 to an exterior of pixel cell 40-1.

In the example of FIG. 10, some of the pixels in partial pixel matrix 30-1 share an anode contact with some of the pixels in partial pixel matrix 30-2. Accordingly, interconnect routing lines 50 may be included to electrically the anode contact in matrix 30-1 with the anode contact in matrix 30-2. The interconnect routing lines 50 may be formed by metal traces (signal lines) on one more layers of substrate 24 and/or conductive vias through one or more layers of substrate 24, as an example. Each interconnect routing line electrically connects two discrete anode contacts. For example, a first anode contact overlaps first and second pixels on the far left column in pixel matrix 30-1. A second anode contact overlaps one pixel on the far right column in pixel matrix 30-2. An interconnect routing line electrically connects these two anode contacts. As another example, the right-most anode contact in passive matrix 30-1 overlaps one pixel. The fifth anode contact (from left to right) in passive matrix 30-2 overlaps four pixels. An interconnect routing line electrically connects these two anode contacts.

As shown in FIG. 10, the pixels in area X2 of passive matrix 30-2 correspond to corresponding omitted pixels in area X1 in passive matrix 30-1. The arrangement of the electrical connections between pixel control circuit 20-1, passive matrix 30-1, and passive matrix 30-2 may be selected such that each pixel in area X2 has a corresponding omitted pixel in area X1. In this way, pixel control circuit may provide output signals as if the pixels in area X1 were actually present. Based on the electrical connections to pixel control circuit 20-1, pixel 1 in area X2 corresponds to pixel 1' in area X1. In other words, pixel 1 in area X2 is driven by pixel control circuit as if it was in the row 1, column 1 position in passive matrix 30-1. However, when pixel control circuit 20-1 outputs control signals to control light emitted by the pixel in the row 1, column 1 position, pixel 1 in area X2 actually emits the light. Based on the electrical connections to pixel control circuit 20-1, pixel 2 in area X2 corresponds to pixel 2' in area X1. In other words, pixel 2 in area X2 is driven by pixel control circuit as if it was in the row 1, column 8 position in passive matrix 30-1. However, when pixel control circuit 20-1 outputs control signals to control light emitted by the pixel in the row 1, column 8 position, pixel 2 in area X2 actually emits the light. Based on the electrical connections to pixel control circuit 20-1, pixel 3 in area X2 corresponds to pixel 3' in area X1. In other words, pixel 3 in area X2 is driven by pixel control circuit as if it was in the row 6, column 8 position in passive matrix 30-1. However, when pixel control circuit 20-1 outputs control signals to control light emitted by the pixel in the row 6, column 8 position, pixel 3 in area X2 actually emits the light. Based on the electrical connections to pixel control circuit 20-1, pixel 4 in area X2 corresponds to pixel 4' in area X1. In other words, pixel 4 in area X2 is driven by pixel control circuit as if it was in the row 4, column 4 position in passive matrix 30-1. However, when pixel control circuit 20-1 outputs control signals to control light emitted by the pixel in the row 4, column 4 position, pixel 1 in area X2 actually emits the light.

Therefore, the driving scheme and logic within pixel control circuit 20-1 does not need to be modified relative to the other pixel control circuits in the display. Pixel control circuit 20-1 outputs signals in the same manner as the other pixel control circuits in the display. However, because of the modified electrical connections, pixel control circuit 20-1 controls the partial passive matrix 30-1 and partial passive matrix 30-2 with the driving scheme.

Normally (e.g., to control a full passive matrix as in FIG. 5), each anode contact in the passive matrix overlaps pixels within one given column of pixels in the overall display. In FIG. 10, in contrast, anode contacts overlapping pixels in separate columns of pixels in the display may be electrically connected. Because the anode contacts are electrically connected, the passive matrix operates electrically as if the pixels were in the same column (as in FIG. 5). However, because of the interconnect between the anode contacts, pixels that are from the same 'column' (electrically) of the passive matrix are physically split between two columns of the display.

In FIG. 10, the anode contacts (e.g., for output terminals 1A-5A) are split between multiple physical locations and each cathode contact is not split between different locations. However, if desired the cathode contacts may be split between different locations (and electrically connected with interconnect routing lines) in the same manner as the anode contacts in FIG. 10.

In FIG. 10, there is a horizontal mirroring of the pixels in area X2 and their corresponding pixels in area X1. In other words, the omitted pixel 1' on the far left of passive matrix 30-1 is mapped to an actual pixel on the far right of passive matrix 30-2, the omitted pixel 2' on the far right of passive matrix 30-1 is mapped to an actual pixel on the far left of passive matrix 30-2, etc. Using horizontal mirroring in this manner may be advantageous for minimizing the complexity of interconnect routing between passive matrices 30-1 and 30-2.

The example in FIG. 10 of pixel control circuit 20-1 providing signals to anode contacts in passive matrix 30-2 through the anode contacts in passive matrix 30-1 is merely illustrative. The opposite arrangement may instead be used, with pixel control circuit 20-1 providing signals to anode contacts in passive matrix 30-1 through the anode contacts in passive matrix 30-2.

Figure 11:
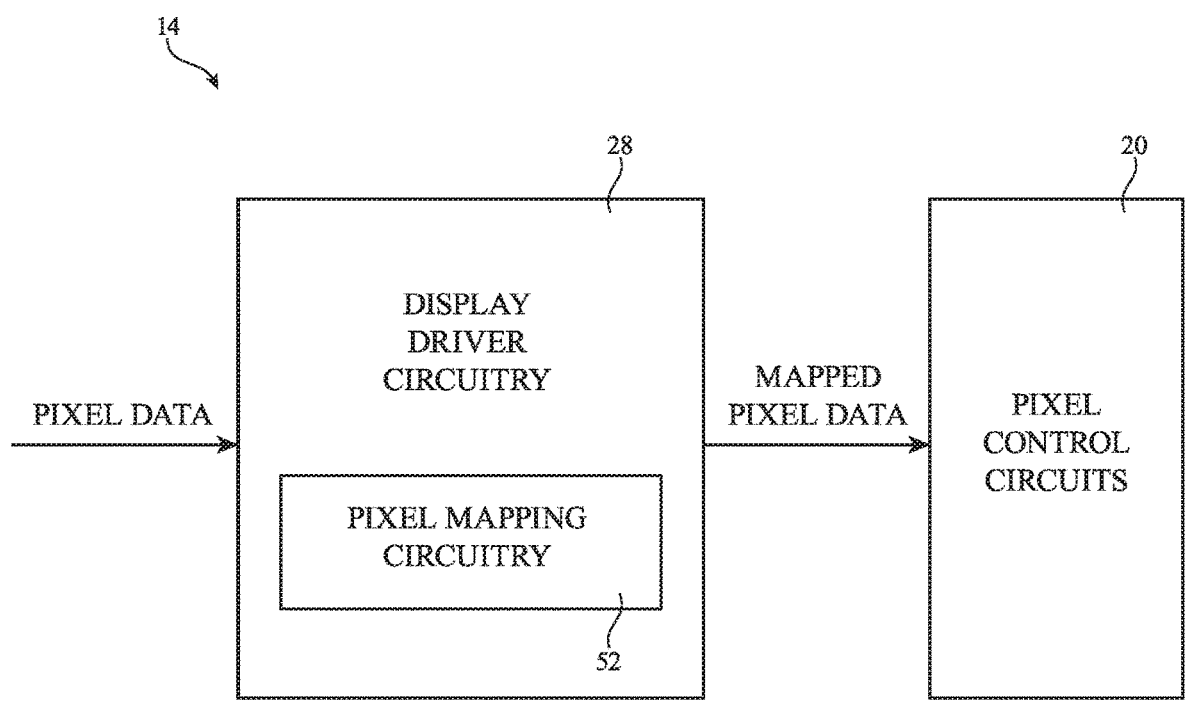
FIG. 11 is a schematic diagram of an illustrative display with pixel mapping circuitry in accordance with an embodiment.

The electronic device may include pixel mapping circuitry that is configured to map target pixel brightness values to corresponding pixels controlled by the pixel control circuits. FIG. 11 is a schematic diagram of an illustrative display where pixel mapping circuitry 52 is included in display driver circuitry 28. Display driver circuitry 28 may receive pixel data (e.g., from a graphics processing unit or other device component) and output corresponding mapped pixel data to pixel control circuits 20 on the display panel for the display.

Pixel mapping circuitry 52 may receive pixel data that corresponds to a target image to be displayed on the display. In other words, the received pixel data may include target brightness values for physical locations across the display. Pixel mapping circuitry 52 maps these target brightness values to specific instructions for each pixel control circuit 20.

As an example, consider pixels 1 and 1' from FIG. 10. Pixel mapping circuitry 52 may receive a target brightness value for pixel 1. Pixel mapping circuitry may map this target brightness value to pixel 1' that is controlled by pixel control circuit 20-1. Then, when the mapped pixel data is used by pixel control circuit 20-1 to operate the pixels, pixel control circuit 20-1 provides outputs to operate pixel 1' at the desired brightness. However, due to the electrical layout of passive matrices 30-1 and 30-2, pixel 1 will emit light at the desired brightness. This type of mapping may be performed for each pixel in the display as necessary.

Figure 12:
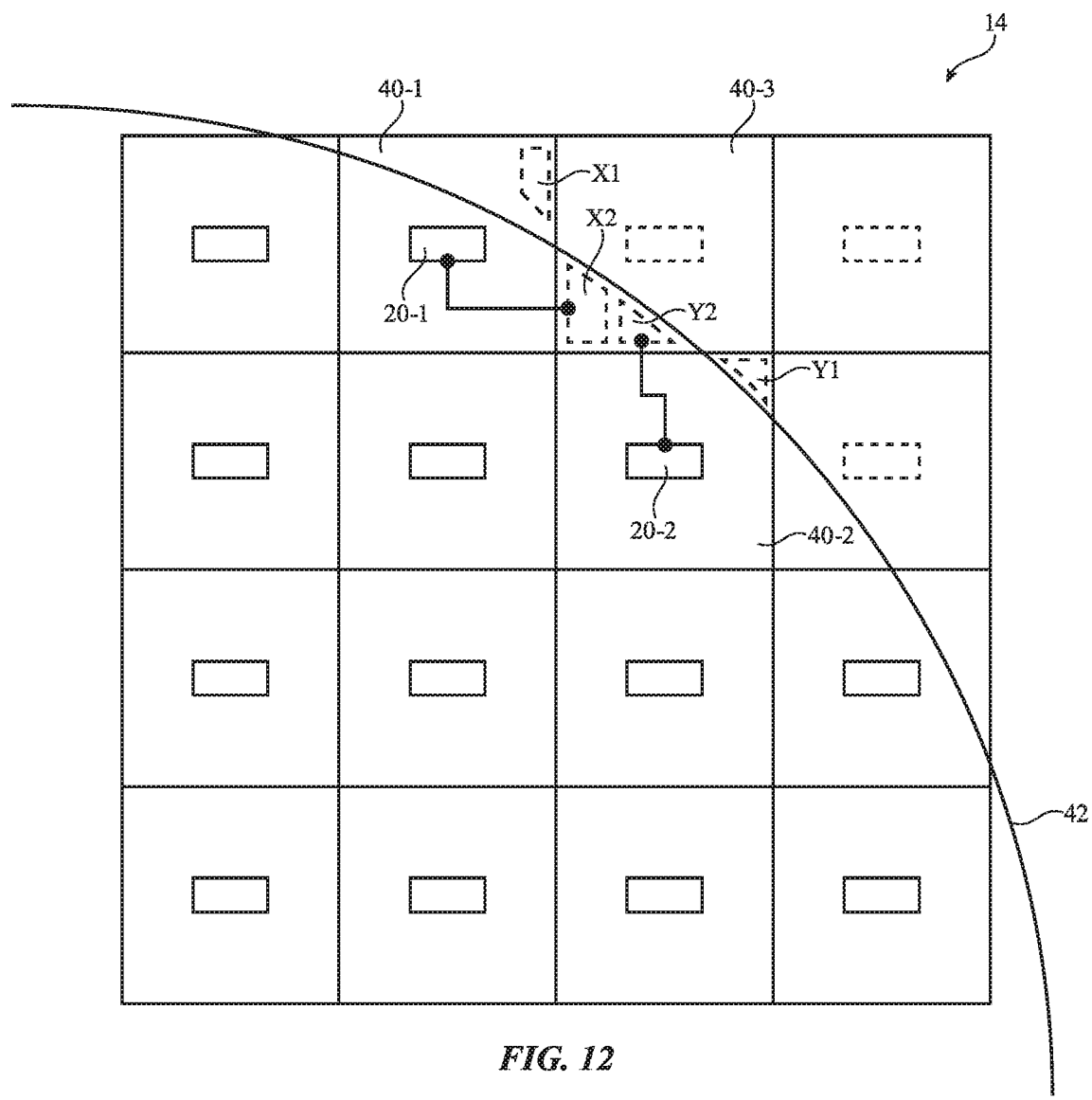
FIG. 12 is a top view of an illustrative display showing how a receptor passive matrix may be controlled by multiple donor pixel control circuits in accordance with an embodiment.

The example in FIGS. 9 and 10 of the pixel control circuit of one neighboring pixel cell being used to control all of the remaining pixels in a given partial pixel cell is merely illustrative. In general, pixels in a partial pixel cell may be controlled by one or more pixel control circuits from neighboring pixel cells. FIG. 12 is a diagram of a partial pixel cell that is controlled by multiple neighboring pixel control circuits.

Partial pixel cell 40-3 includes a first subset of pixels in area X2 and a second subset of pixels in area Y2 but does not have a dedicated pixel control circuit. Pixel cell 40-1 includes pixel control circuit 20-1 (arranged per the regular pixel control circuit pattern). Pixel cell 40-1 is interrupted by border 42 and is therefore a partial pixel cell. Pixels such as pixels X1 outside of the target border would normally be driven by pixel control circuit 20-1. However, the pixels in area X1 are omitted from the display because they are outside the border 42. The pixels in area X2 may be driven by the underutilized, neighboring pixel control circuit 20-1.

Pixel cell 40-2 includes pixel control circuit 20-2 (arranged per the regular pixel control circuit pattern). Pixel cell 40-2 is interrupted by border 42 and is therefore a partial pixel cell. Pixels such as pixels Y1 outside of the target border would normally be driven by pixel control circuit 20-2. However, the pixels in area Y1 are omitted from the display because they are outside the border 42. The pixels in area Y2 may be driven by the underutilized, neighboring pixel control circuit 20-2.

Using this type of scheme, multiple underutilized pixel control circuits are used to control pixels in a single partial pixel cell 40-3. This example is merely illustrative. In general, any partial pixel cell without a dedicated pixel control circuit (sometimes referred to as a receptor) may be controlled by pixel control circuits from any desired number of neighboring pixel cells (sometimes referred to as donor pixel cells with donor pixel control circuits).

Thus far, an example has been described where the target border for the display has rounded corners. The rounded corners may cause partial pixel cells that use any of the driving techniques discussed in connection with FIGS. 8-12. However, other display layouts may also cause partial pixel cells that use any of the driving techniques discussed in connection with FIGS. 8-12.

Figure 13A:
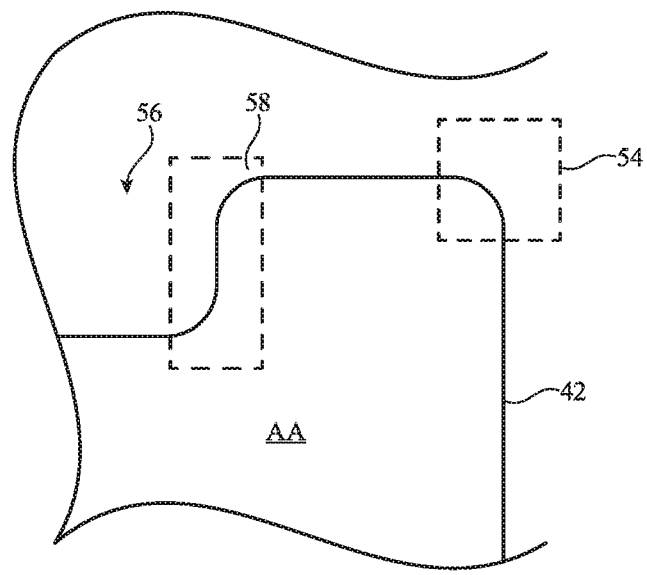
FIG. 13A is a top view of an illustrative display with a rounded corner and a notch in accordance with an embodiment.

FIG. 13A is a top view of a display with a light-emitting active area (AA) that has a footprint with a rounded corner 54. The upper-right corner of the display (when viewed from above) is shown in FIG. 13A. However, all four corners of the active area may be rounded corners if desired. The rounded corner 54 may cause partial pixel cells that use any of the driving techniques discussed in connection with FIGS. 8-12. Additionally, a notch 56 is formed along an upper edge of the active area. Notch 56 may cause border 42 to have curvature in one or more portions of region 58 that defines the notch. The presence of notch 56 may also cause partial pixel cells (e.g., in region 58) that use any of the driving techniques discussed in connection with FIGS. 8-12.

Figure 13B:
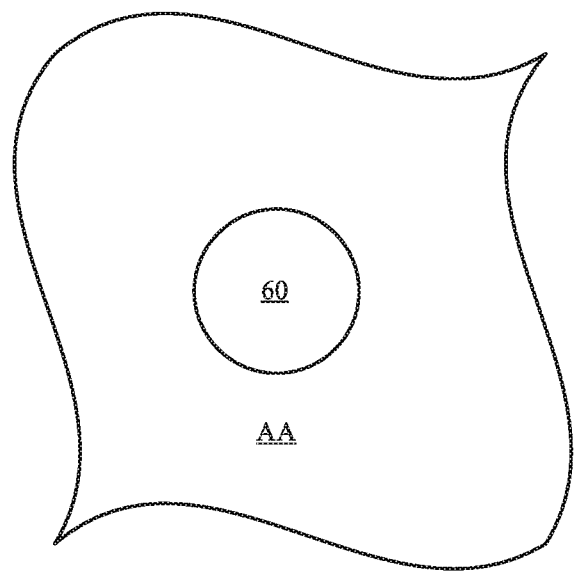
FIG. 13B is a top view of an illustrative display with an opening in the active area in accordance with an embodiment.

FIG. 13B is a top view of a display with a light-emitting active area (AA) that has an opening 60. The opening may be a physical hole in the display panel, as one example. The opening is laterally surrounded by the light-emitting active area AA. Opening 60 may cause partial pixel cells (e.g., adjacent the border of opening 60) that use any of the driving techniques discussed in connection with FIGS. 8-12.

In general, a display having a footprint of any arbitrary shape (e.g., with a border having one or more curved portions and/or one or more linear portions) may result in partial pixel cells that do not have dedicated pixel control circuits. When the display design causes partial pixel cells that do not have dedicated pixel control circuits, any of the driving techniques discussed in connection with FIGS. 8-12 may be used (regardless of the exact shape of the light-emitting active area).

In addition to using pixel mapping circuitry 52 to provide modified pixel data to the pixel control circuits 20, display driver circuitry 28 may perform black painting for omitted pixels within the display. Consider the example of FIG. 10 where some of the omitted pixels 22' in passive matrix 30-1 are mapped to physical pixels in passive matrix 30-2. Other omitted pixels 22' in passive matrix 30-1 (e.g., the omitted pixels 22' outside of area X1) are not mapped to any physical pixels in the display. Since there are no pixels in these locations, light cannot be emitted in these locations. Accordingly, in some arrangements these omitted pixels may not receive a target brightness level (and may correspondingly have a random target brightness level or dummy brightness level assigned during the control operations). However, pixel control circuit 20-1 may still be configured to generate control signals for a full 8×8 passive matrix (even though some of the pixels in the passive matrix are physically omitted). If random and/or non-zero target brightness values are used for the omitted pixels, pixels within the active area may be undesirably caused to turn on when pixel control circuit 20-1 operates the passive matrix (even if the active area pixels are not intended to be turned on).

To prevent undesired light emission from occurring, display driver circuitry 28 may assign a zero gray level to each omitted pixel in the display. The zero gray level may correspond to a physical light-emitting diode being kept off during operation (e.g., where light is not emitted by the pixel and the pixel appears black). This process may be referred to as black painting. During the black painting, each omitted pixel is assigned the zero gray level. Then, when the modified pixel data (with the zero gray levels for the omitted pixels) is provided to pixel control circuits 20, undesired light emission is mitigated. The black painting process may optionally be performed by pixel mapping circuitry 52.

It should be noted that the footprint of the active area of the display may be selected to reduce the number of partial pixel cells in the display and/or the number of partial pixel cells in the display without dedicated pixel control circuits. As an example, a minor tweak in the radius of curvature of the rounded corner of the display may cause a meaningful reduction in the number of receptor pixel cells that require corresponding donor pixel cells. Similarly, minor tweaks in the number of total rows and columns in the active area may cause a meaningful reduction in the number of receptor pixel cells that require corresponding donor pixel cells. In general, the size and shape of the active area of the display may be selected to optimize the number and arrangement of partial pixel cells in the display if desired. The position of the grid of pixel control circuits may also be centered (in both the X-direction and Y-direction) relative to the light-emitting active area to optimize the number and arrangement of partial pixel cells in the display if desired.

Figure 14:
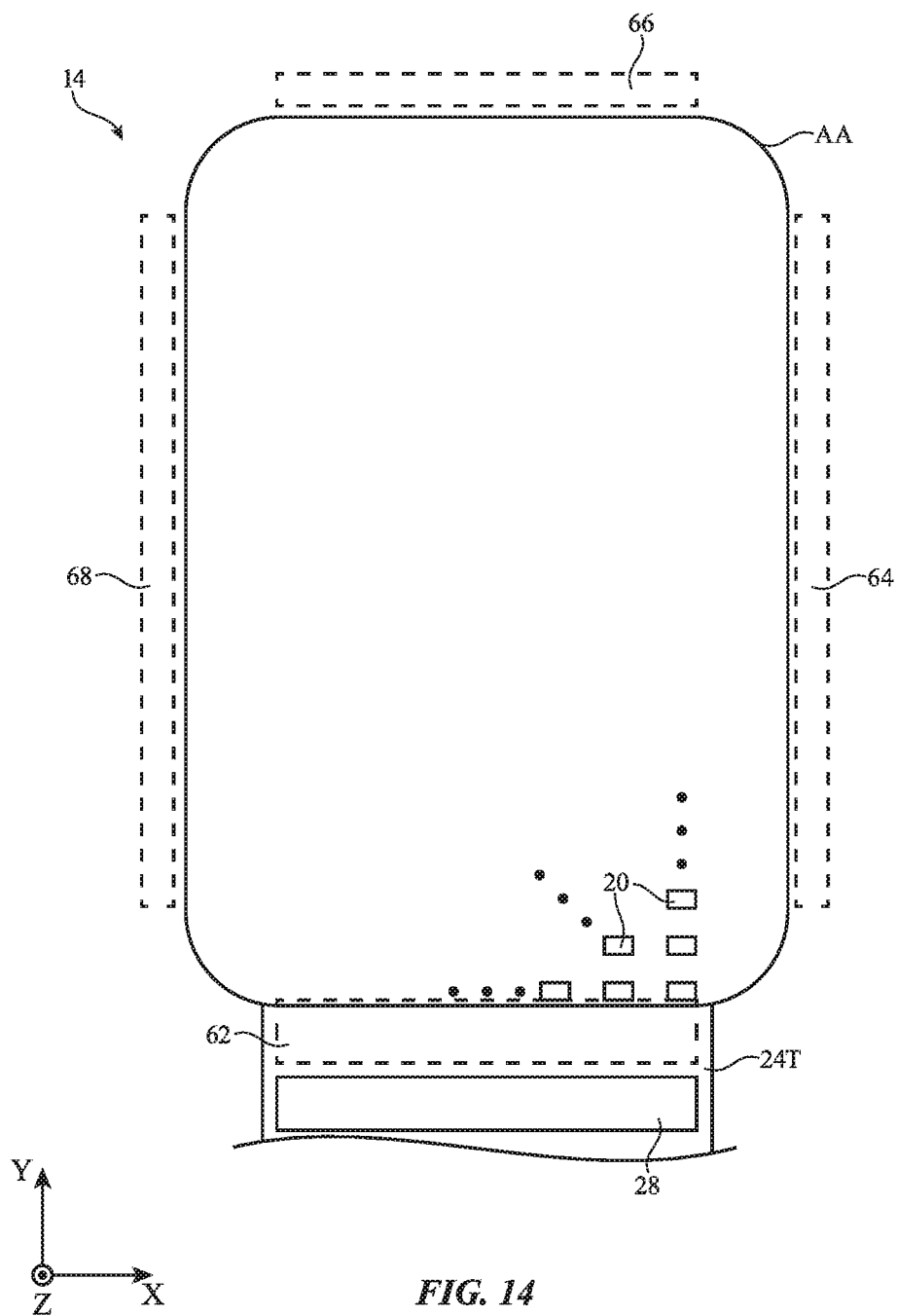
FIG. 14 is a top view of an illustrative display with fanout signal lines in an inactive area of the display in accordance with an embodiment.

Various signal lines (e.g., data signal lines, global signal lines, and power supply lines) may be included in the display to operate pixel control circuits 20 and light-emitting diodes 22. FIG. 14 is a top view of an illustrative display with fanout signal lines that are used to provide the necessary signals from the display driver circuitry to signal lines for the display. As shown in FIG. 14, the display may include a light-emitting active area AA that includes pixel control circuits 20 arranged in an array of rows and columns. As previously shown and discussed, each pixel control circuit controls one or more passive matrices of light-emitting diodes.

As shown in FIG. 14, display driver circuitry 28 may be formed on a panel tail 24T. Panel tail 24T may be formed by an extension of substrate 24. The extension of substrate 24 may optionally be flexible/bendable. Panel tail 24T may be electrically connected to a flexible printed circuit or other components within electronic device 10. Display driver circuitry 28 may be formed on panel tail 24T, may be formed on a flexible printed circuit that is electrically connected to panel tail 24T, or may be formed in another desired location within device 10. In one illustrative arrangement, panel tail 24T may be bent (e.g., a 180 degree bend) to electrically connect to a printed circuit board that is underneath display 14.

Display driver circuitry 28 may provide various signals to pixel control circuits 20 that are used to operate the array of light-emitting diodes in display 14. However, the width of display driver circuitry 28 (and tail 24T) is less than the width of the active area of the display. Therefore, to provide signals to all of the pixel control circuits as necessary, a fanout signal line region 62 is included in the display. Fanout signal lines in region 62 may be used to spread signals from display driver circuitry 28 to all of the regions of display 14 (e.g., the full width of the active area).

In the example of FIG. 14, fanout signal line region 62 is formed on panel 24T outside of the light-emitting active area AA. FIG. 14 similarly shows how peripheral signal lines (e.g., power supply lines) may be formed outside the active area in regions 64, 66, and 68. Region 64 extends along the right edge of the active area (outside of the active area), region 66 extends along the upper edge of the active area (outside of the active area), and region 68 extends along the left edge of the active area (outside of the active area). The display may include any desired components such as power supply lines in these regions.

In FIG. 14, regions 62, 64, 66, and 68 are all positioned outside of the light-emitting active area AA of the display. The substrate 24 therefore must have a non-light-emitting inactive area that is sufficiently large to accommodate regions 62, 64, 66, and 68. Alternatively, regions 62, 64, 66, and/or 68 may be positioned inside the light-emitting active area to reduce the size of the non-light-emitting inactive area.

Figure 15:
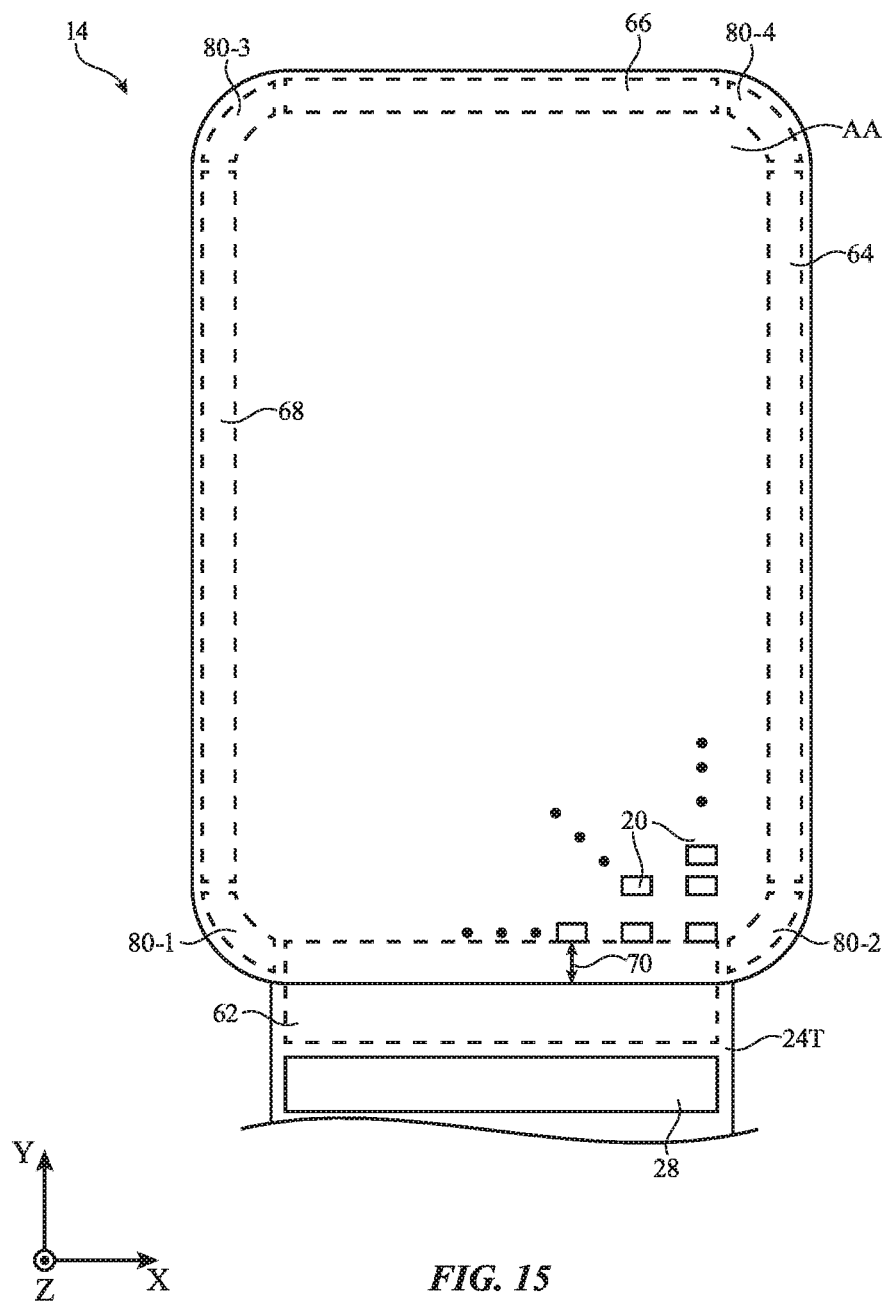
FIG. 15 is a top view of an illustrative display with fanout signal lines in an active area of the display in accordance with an embodiment.

FIG. 15 is a top view of an illustrative display having a fanout signal line region in the active area of the display. As shown in FIG. 15, fanout signal line region 62 at least partially overlaps active area AA. The signal lines in fanout region 62 may be formed between and/or under light-emitting diodes within active area AA, as is shown in greater detail in FIG. 16.

To increase the amount of fanout signal line region 62 that can be shifted into the active area (thereby reducing the size requirements for the inactive area), pixel control circuits 20 may be positioned within the active area to maximize the gap between the edge of the active area and the pixel control circuits. As shown in FIG. 15, the row of pixel control circuits closest to the lower edge of the active area (which is the edge adjacent to the display driver circuitry and therefore the fanout signal line region) is positioned with a gap 70 between the pixel control circuits and the lower edge of the active area. Gap 70 may include a full column of light-emitting diodes from a passive matrix controlled by the pixel control circuit. Consider the previous example where each pixel control circuit controls four 8×8 passive matrices of light-emitting diodes. Gap 70 may therefore be equal to the pitch of eight light-emitting diodes to ensure that eight rows of light-emitting diodes are interposed between the pixel control circuits and the lower edge of the active area. This ensures that the bottom row of pixel control circuits can still fully control all of the light-emitting diodes along the lower edge of the active area while also maximizing the space in the active area that can accommodate fanout signal line region 62.

In addition to forming fanout signal line region 62 at least partially in the active area, one or more peripheral signal lines (e.g., power supply lines) may be formed inside the active area in regions 64, 66, and 68. In FIG. 15, region 64 extends along the right edge of the active area (inside of the active area), region 66 extends along the upper edge of the active area (inside of the active area), and region 68 extends along the left edge of the active area (inside of the active area). The display may include any desired components such as power supply lines in these regions.

Additionally, one or more peripheral signal lines (e.g., power supply lines) may be formed inside the active area in the rounded corners of the display. FIG. 15 shows rounded corner regions 80-1, 80-2, 80-3, and 80-4. In FIG. 15, region 80-1 extends along the lower-left corner of the active area (inside of the active area) between regions 68 and 62, region 80-2 extends along the lower-right corner of the active area (inside of the active area) between regions 64 and 62, region 80-3 extends along the upper-left corner of the active area (inside of the active area) between regions 68 and 66, and region 80-4 extends along the upper-right corner of the active area (inside of the active area) between regions 66 and 64. The display may include any desired components such as power supply lines in these regions.

Figure 16:
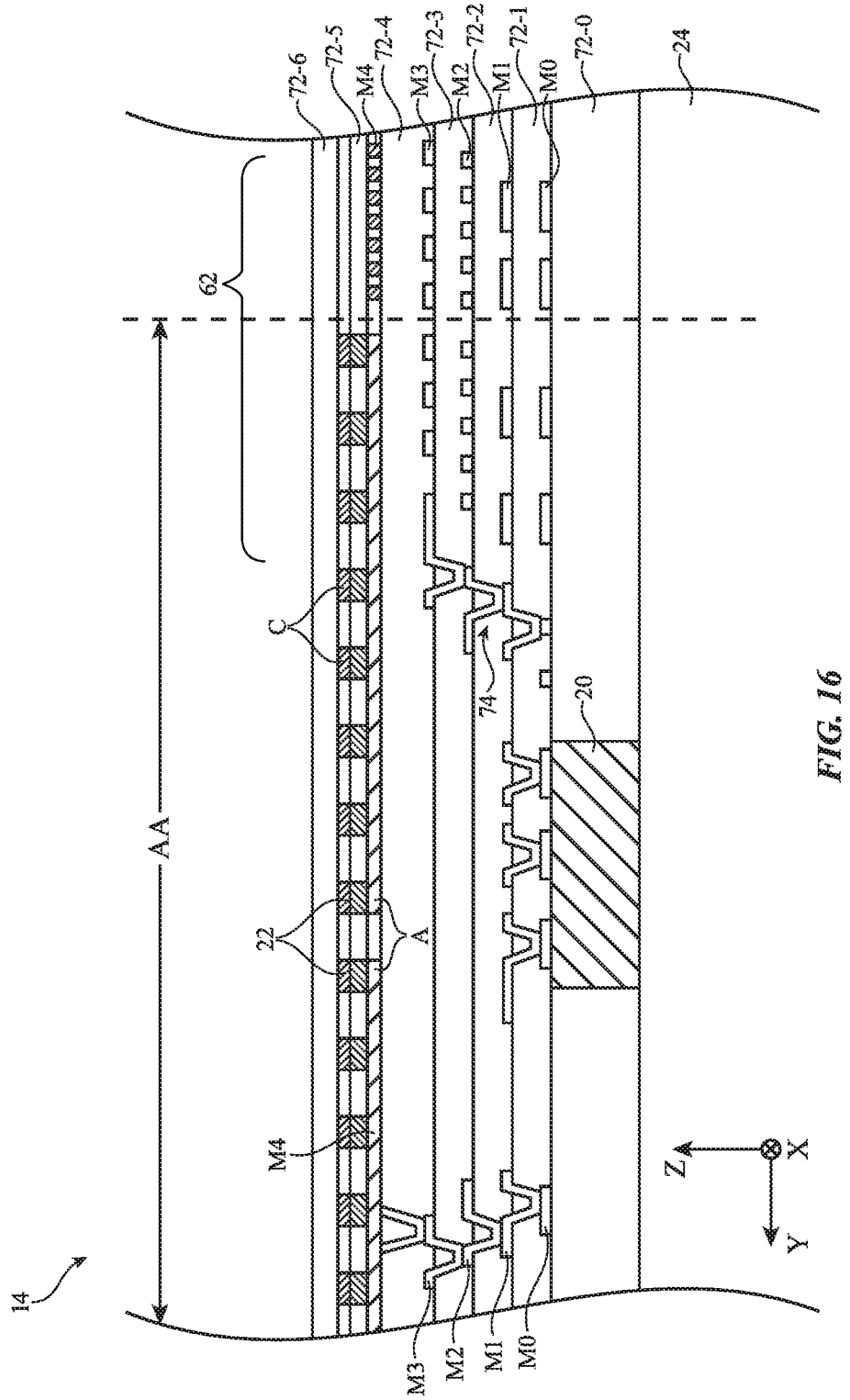
FIG. 16 is a cross-sectional side view of an illustrative display with a fanout signal line region in an active area in accordance with an embodiment.

FIG. 16 is a cross-sectional side view of an illustrative display having a fanout signal line region 62 at least partially overlapping the display active area. FIG. 16 shows a pixel control circuit 20 mounted on substrate 24. Pixel control circuit 20 may be attached to substrate 24 using an adhesive layer, as one example. A common adhesive layer may attach multiple pixel control circuits to substrate 24. Additional dielectric layers 72-0, 72-1, 72-2, 72-3, 72-4, 72-5, and 72-6 are formed over substrate 24 and may optionally be referred to as substrate layers. A plurality of metal layers including metal layers M0, M1, M2, M3, and M4 are also formed over the substrate between the dielectric layers. Various vias 74 may be included to electrically connect different metal layers within the display.

Specifically, dielectric layer 72-0 is formed over substrate 24 (coplanar with pixel control circuit 20). Dielectric layer 72-0 may be referred to as a planarization layer. Metal layer M0 is formed on dielectric layer 72-0. Dielectric layer 72-1 is formed over metal layer M0. Metal layer M1 is formed on dielectric layer 72-1. Dielectric layer 72-2 is formed over metal layer M1. Metal layer M2 is formed on dielectric layer 72-2. Dielectric layer 72-3 is formed over metal layer M2. Metal layer M3 is formed on dielectric layer 72-3. Dielectric layer 72-4 is formed over metal layer M3. Metal layer M4 is formed on dielectric layer 72-4. Dielectric layer 72-5 is formed over metal layer M4.

In the active area AA, metal layer M4 may form anode contacts A for passive matrices of light-emitting diodes that are controlled by pixel control circuits 20. Light-emitting diodes 22 are formed between the anode contacts A and corresponding cathode contacts C. A planarization layer 72-6 may be formed over the cathode contacts C.

In the signal fanout region 62, metal layers M0 and M1 may be patterned to form fanout signal lines for conveying power and analog signals. For example, metal layers M0 and M1 may include positive power supply lines and negative power supply lines. In the signal fanout region 62, metal layers M2 and M3 may be patterned to form global signal lines for the display. The global signal lines may be used to convey, as an example, clocks signals to the pixel control circuits. In the signal fanout region 62, metal layer M4 may be patterned to form data signal lines for the display. The data signal lines may be used to convey display data that is used by the pixel control circuits to operate the light-emitting diodes at target brightness values (thus displaying a target image). The signal lines formed using metal layer M4 may be digital signal lines that convey digital signals.

Metal layer M4 is used to form the anode contacts A in the active area. Accordingly, metal layer M4 is only patterned to form fanout lines outside of the light-emitting active area AA. The fanout signal lines formed using metal layer M4 do not overlap the light-emitting active area. In contrast, metal layers M2 and M3 are patterned to form fanout lines in both the active area and the inactive area of the display. Similarly, metal layers M0 and M1 are patterned to form fanout lines in both the active area and the inactive area of the display.

The fanout signal lines in region 62 may be electrically connected to additional signal lines in the active area of the display that convey signals throughout the display (e.g., to the pixel control circuits). The fanout signal lines may be electrically connected to signal lines that are patterned using the same metal layer as in the fanout region or to signal lines that are patterned using a different metal layer than in the fanout region (and are electrically connected using one or more vias).

Figure 17:
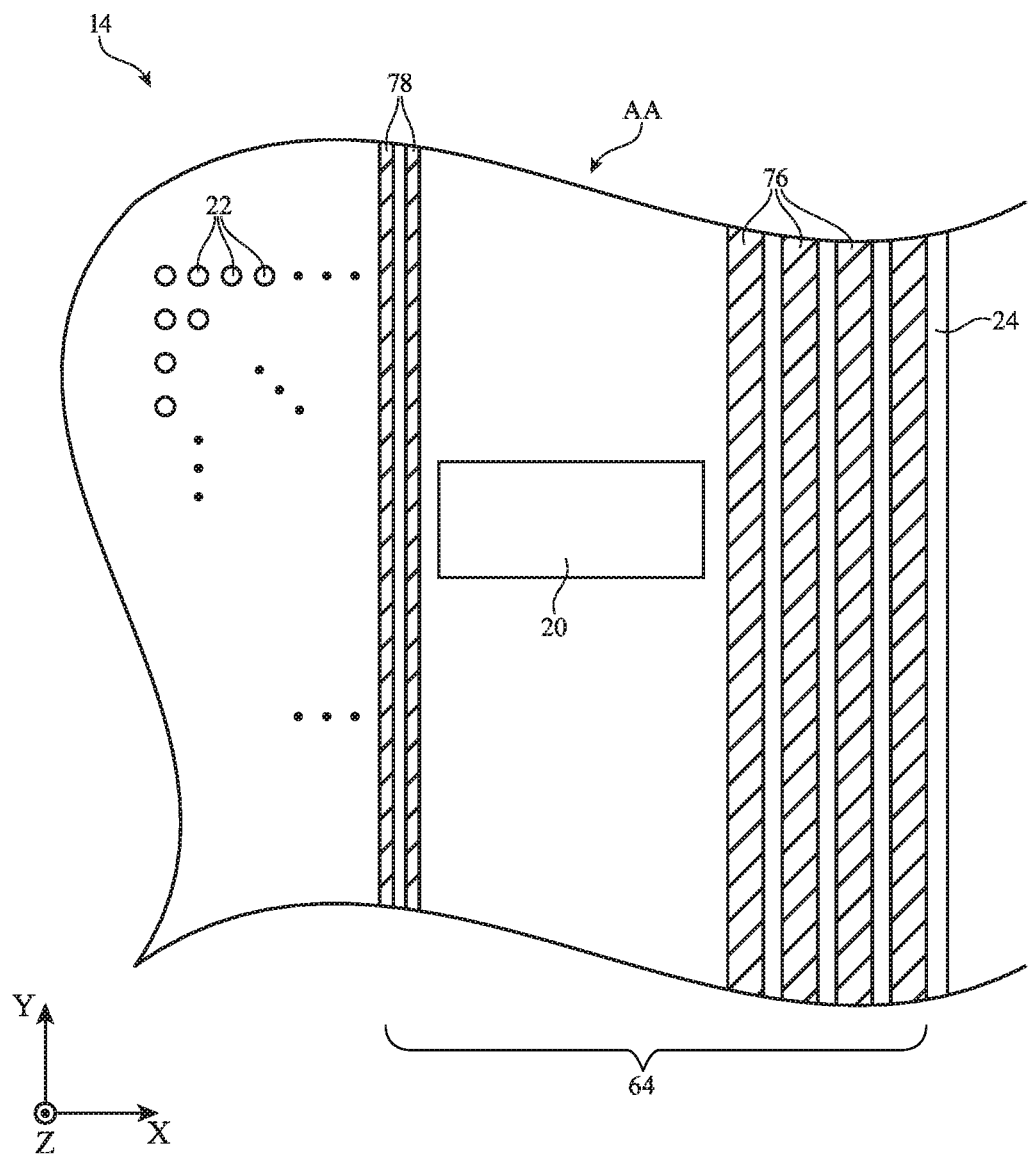
FIG. 17 is a top view of an illustrative display with peripheral signal lines in an active area of the display in accordance with an embodiment.

FIG. 17 is a top view of an illustrative display having peripheral signal lines formed inside the active area. As shown in FIG. 17, signal lines such as power supply lines 76 may be formed along the edge of the active area inside the active area in region 64 between pixel control circuits 20 (e.g., a right-most column of pixel control circuits that extend in the Y-direction) and a right edge of the active area. Additional signal lines such as global signal lines 78 may be formed along the edge of the active area inside the active area in region 64. Pixel control circuit 20 (e.g., a right-most column of pixel control circuits that extend in the Y-direction) is interposed between global signal lines 78 and power supply lines 76 in this example. In general, signal lines may be included at the edge of the active area in region 64 (as shown in FIG. 17), in region 66, in region 68, in region 80-1, in region 80-2, in region 80-3, and/or in region 80-4.

To maximize the amount of room along the left and right edges of the active area to accommodate signal lines such as power supply lines, the array of pixel control circuits may be centered relative to the left and right edges of the active area. This provides an equal amount of space on both the left and right edges of the active area to accommodate signal lines.

The example in FIGS. 14 and 15 of panel tail 24T (with corresponding fanout signal line region 62) being formed along the bottom edge of the display is merely illustrative. In general, the panel tail and the display driver circuitry may be formed along any desired edge(s) of the display. Regardless of the position of the display driver circuitry and panel tail, a fanout signal line region may be included adjacent to the display driver circuitry and panel tail and the other edges of the display may include peripheral signal lines.

As previously shown in connection with FIGS. 7-9, target border 42 may cross through some of pixel cells 40. This causes some of the pixel cells to be partial pixel cells. Pixels outside of border 42 within pixel cell 40-2 may be omitted from the display. Additionally, pixel control circuits outside of the target border may be omitted from the display. To mitigate these issues, additional pixel control circuits may be included to control the partial pixel cells (as in FIG. 8) or the pixel driver circuit of a neighboring partial pixel cell may be used to drive the pixels of a partial pixel cell (as in FIG. 9).

Figure 18A:
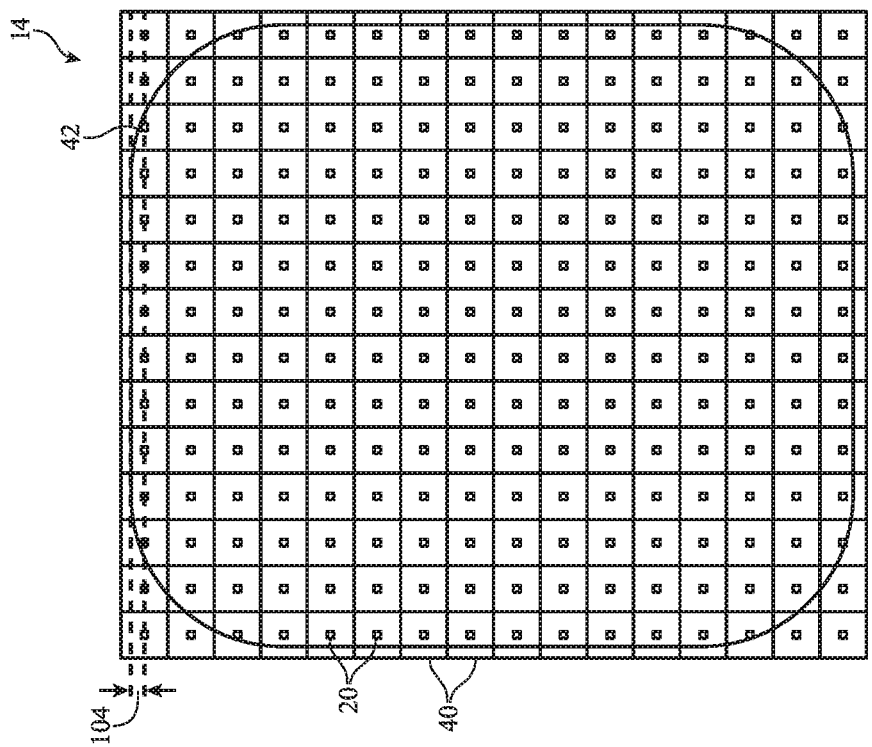
FIG. 18A is a top view of an illustrative display where the first row of pixels in the display active area is aligned with the top of the pixel cells controlled by the first row of pixel control circuits in accordance with an embodiment.

Instead of or in addition to using the techniques of FIG. 8 and/or FIG. 9, the first pixel row may optionally be shifted relative to the first row of pixel control circuits if desired. FIG. 18A is a top view of an illustrative display where the first row of pixels in the display active area is aligned with the top of the pixel cells controlled by the first row of pixel control circuits 20. The number of pixel rows in distance 102 in FIG. 18A is equal to half of the total number of pixel rows in each cell 40.

Consider an example where each pixel control circuit controls four 8×8 passive matrices, for a total of 16 rows and 16 columns of pixels. In this case, the distance 102 in FIG. 18A is 8 rows of pixels. Therefore, the first row of pixel control circuits has no partial pixel cells outside of the rounded corner areas. The top of the control area of the first (top) row of pixel control circuits is aligned with the top row of pixels in the active area.

Figure 18B:
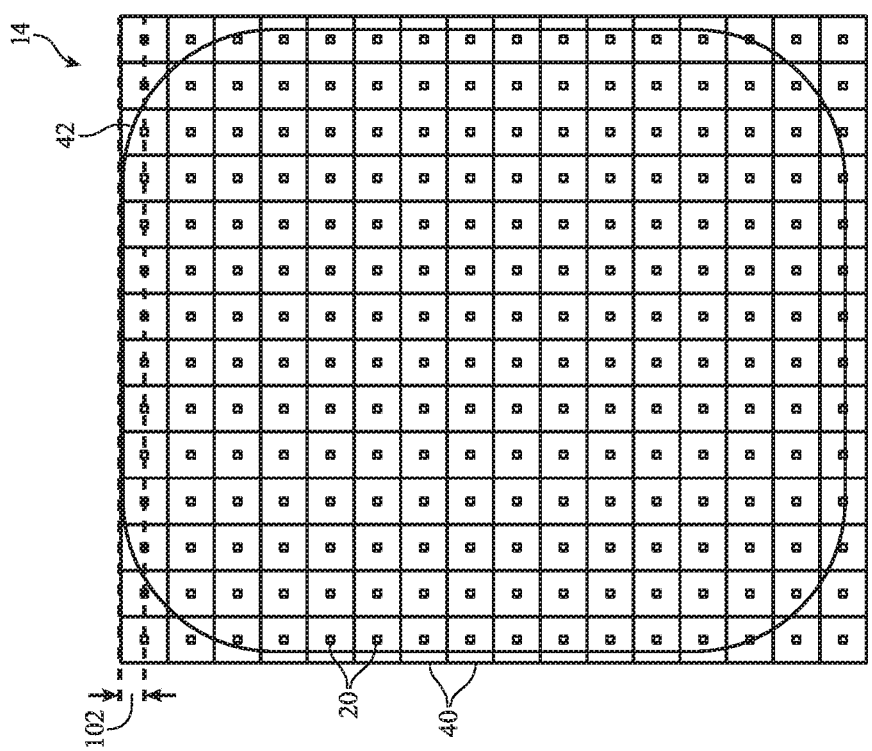
FIG. 18B is a top view of an illustrative display where the first row of pixels in the display active area is not aligned with the top of the pixel cells controlled by the first row of pixel control circuits in accordance with an embodiment.

In contrast, in FIG. 18B, the first row of pixels in the display active area is not aligned with the top of the pixel cells controlled by the first row of pixel control circuits 20. The number of pixel rows in distance 104 in FIG. 18B is less than half of the total number of pixel rows in each cell 40.

Consider an example where each pixel control circuit controls four 8×8 passive matrices, for a total of 16 rows and 16 columns of pixels. In this case, the distance 104 in FIG. 18B is 6 rows (e.g., 7 rows or less) of pixels. Therefore, the first row of pixel control circuits has partial pixel cells in both the rounded corner areas and along the entire upper edge of the active area (outside of the rounded corner areas). The top of the control area of the first row of pixel control circuits is shifted relative to the top row of pixels in the active area.

Adjusting the position of the active area relative to the pixel control circuits (as in FIG. 18B) may reduce the overall number of pixels (in partial pixel cells in the rounded corner areas) that need mapping (thus reducing the need for the solutions of FIG. 8 and/or FIG. 9).

Figure 19:
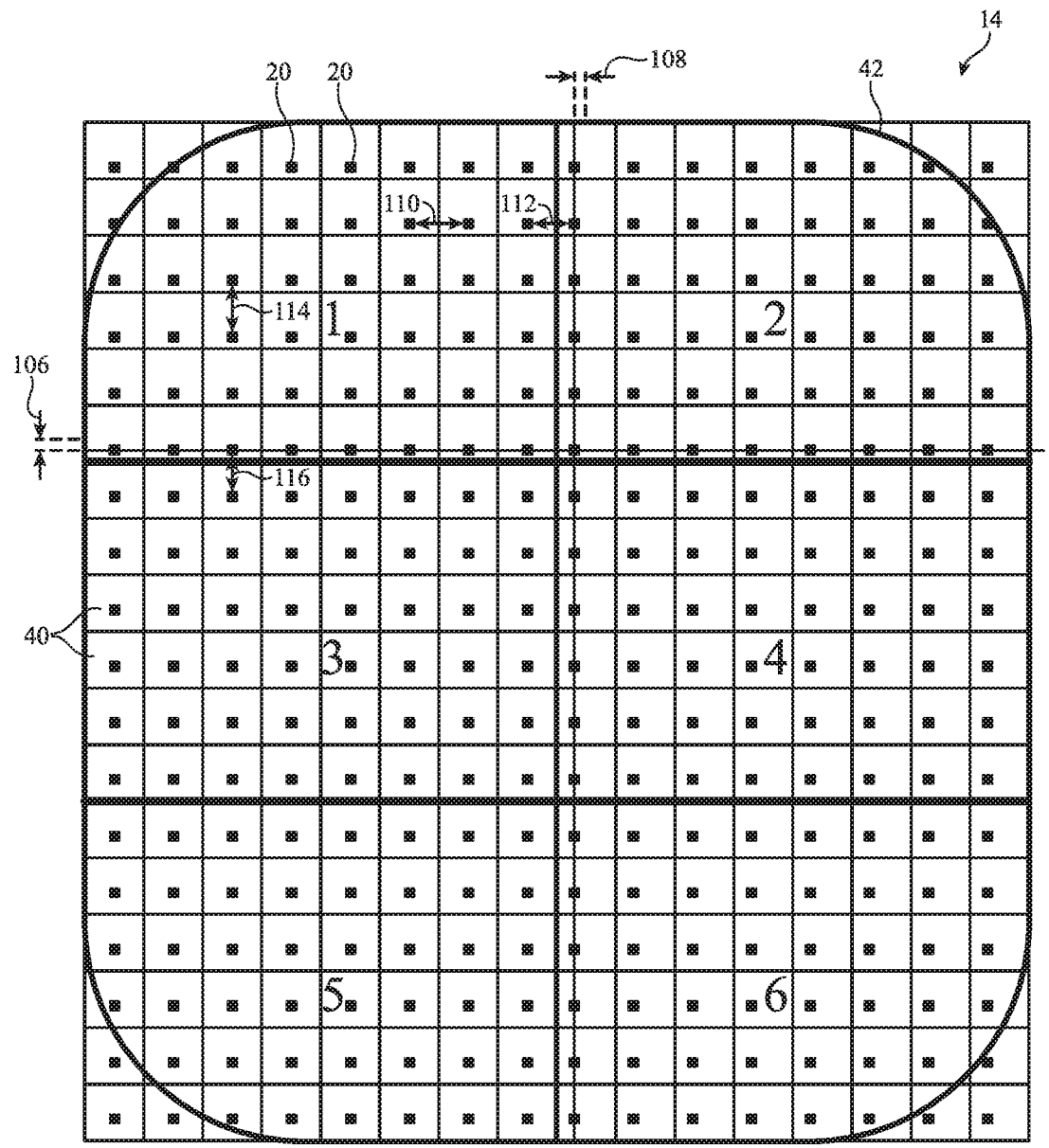
FIG. 19 is a top view of an illustrative display with pixel control circuits formed in different stamps in accordance with an embodiment.

During manufacturing, the pixel control circuits may be transferred by mass transfer array (MTA) in several discrete stamps to form the pixel control circuits for the entire display. The discrete stamps of pixel control circuits may be manufactured separately and then combined to form a single unitary array of pixel control circuits. In the example of FIG. 19, six different stamps (labeled 1, 2, 3, 4, 5, and 6) form the pixel control circuits for display 14. The size and overlap of each stamp may be selected to mitigate the number of overall number of pixels that need mapping (in partial pixel cells in the rounded corner areas).

As shown in FIG. 19, a vertical offset 106 e.g., for the uppermost stamps 1 and 2) and/or a horizontal offset 108 (e.g., for the right-most stamps 2, 4, and 6) may be used to optimize the number of pixels that need mapping. This may result in the horizontal pitch 110 for the majority of the pixel control circuits being less than pitch 112 between pixel control circuits of different, adjacent stamps (e.g., between stamps 1 and 2 in FIG. 19). Similarly, the total vertical pitch 114 for the majority of the pixel control circuits may be less than pitch 116 between pixel control circuits of different, adjacent stamps (e.g., between stamps 1 and 3 in FIG. 19).

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
   display driver circuitry;
   an array of light-emitting diodes arranged in a light-emitting area;
   an array of control circuits, wherein each one of the control circuits is configured to control at least one passive matrix of the light-emitting diodes based on signals from the display driver circuitry; and
   fanout signal lines that are coupled to the display driver circuitry and that receive the signals from the display driver circuitry, wherein the fanout signal lines at least partially overlap the light-emitting area and wherein the fanout signal lines include a first patterned metal layer, a second patterned metal layer that is formed over the first patterned metal layer, a third patterned metal layer that is formed over the second patterned metal layer, a fourth patterned metal layer that is formed over the third patterned metal layer, and a fifth patterned metal layer that is formed over the fourth patterned metal layer.

2. The electronic device defined in claim 1, wherein the fanout signal lines are interposed between a row of control circuits and an edge of the light-emitting area.

3. The electronic device defined in claim 1, wherein the array of control circuits is arranged in rows and columns, wherein the rows include a bottom row adjacent a lower edge of the light-emitting area, and wherein the fanout signal lines are interposed between the bottom row of control circuits and the lower edge of the light-emitting area.

4. The electronic device defined in claim 3, wherein each passive matrix of the light-emitting diodes includes a given number of rows of light-emitting diodes and wherein the given number of rows of light-emitting diodes is interposed between the bottom row of control circuits and the lower edge of the light-emitting area.

5. The electronic device defined in claim 1, wherein each passive matrix includes a plurality of anode contacts and a plurality of cathode contacts that extend orthogonally to the plurality of anode contacts.

6. The electronic device defined in claim 1, further comprising:
   power supply lines that at least partially overlap the light-emitting area.

7. The electronic device defined in claim 6, wherein the power supply lines are interposed between a column of control circuits and an edge of the light-emitting area.

8. The electronic device defined in claim 6, wherein the array of control circuits is arranged in rows and columns, wherein the columns include a right-most column adjacent a right edge of the light-emitting area, and wherein the power supply lines are interposed between the right-most column of control circuits and the right edge of the light-emitting area.

9. The electronic device defined in claim 8, further comprising:
   global signal lines that extend parallel to the right edge of the light-emitting area, wherein the right-most column of control circuits is interposed between the global signal lines and the power supply lines.

10. The electronic device defined in claim 6, wherein the power supply lines overlap a rounded corner region of the light-emitting area.

11. The electronic device defined in claim 1, wherein the light-emitting area has first and second opposing edges and wherein the array of control circuits is centered relative to the first and second opposing edges.

12. The electronic device defined in claim 1, wherein fanout signal lines formed from the first and second patterned metal layers convey power supply signals.

13. The electronic device defined in claim 12, wherein fanout signal lines formed from the third and fourth patterned metal layers convey global signals.

14. The electronic device defined in claim 13, wherein fanout signal lines formed from the fifth patterned metal layer convey data signals.

15. The electronic device defined in claim 14, wherein the fifth patterned metal layer has portions that form anode contacts for the passive matrices of the light-emitting diodes, wherein the fanout signal lines formed from the first and second patterned metal layers at least partially overlap the light-emitting area, wherein the fanout signal lines formed from the third and fourth patterned metal layers at least partially overlap the light-emitting area, and wherein the fanout signal lines formed from the fifth patterned metal layer do not overlap the light-emitting area.

16. The electronic device defined in claim 1, wherein the array of control circuits is interspersed with the array of light-emitting diodes.

17. An electronic device comprising:
    display driver circuitry;
    an array of light-emitting diodes having first and second opposing edges connected by third and fourth opposing edges;
    an array of control circuits arranged in rows and columns, wherein each one of the control circuits is configured to control at least one passive matrix of the light-emitting diodes based on signals from the display driver circuitry, wherein each passive matrix includes a given number of rows of light-emitting diodes, and wherein the given number of rows of light-emitting diodes are interposed between the row of control circuits and the first edge of the array of light-emitting diodes; and
    fanout signal lines that are coupled to the display driver circuitry and that receive the signals from the display driver circuitry, wherein the fanout signal lines are formed between a row of control circuits and the first edge of the array of light-emitting diodes.

18. An electronic device comprising:
    display driver circuitry;
    an array of light-emitting diodes having first and second opposing edges connected by third and fourth opposing edges;
    an array of control circuits arranged in rows and columns, wherein each one of the control circuits is configured to control at least one passive matrix of the light-emitting diodes based on signals from the display driver circuitry and wherein the array of control circuits is centered relative to the third and fourth opposing edges; and
    power supply lines that extend along at least the third edge, wherein the power supply lines are overlapped by the array of light-emitting diodes and wherein the centered array of control circuits provides equal space on the third and fourth edges to accommodate the power supply lines.

19. The electronic device defined in claim 18, wherein the array of control circuits is centered relative to the first and second opposing edges.

20. The electronic device defined in claim 18, further comprising:

signal lines that extend along at least the third edge, wherein the signal lines are overlapped by the array of light-emitting diodes and wherein at least one control circuit of the array of control circuits is interposed between the power supply lines and the signal lines.

\* \* \* \* \*